US 012183537B2

(12) United States Patent
Verschueren et al.

(10) Patent No.: US 12,183,537 B2
(45) Date of Patent: *Dec. 31, 2024

(54) SYSTEMS AND METHODS OF HYSTERESIS COMPENSATION

(71) Applicant: FEI Company, Hillsboro, OR (US)

(72) Inventors: Edwin Verschueren, Mierlo (NL); Paul Tacx, Roermond (NL)

(73) Assignee: FEI Company, Hillsboro, OR (US)

( * ) Notice: Subject to any disclaimer, the term of this patent is extended or adjusted under 35 U.S.C. 154(b) by 58 days.

This patent is subject to a terminal disclaimer.

(21) Appl. No.: 18/059,585

(22) Filed: Nov. 29, 2022

(65) Prior Publication Data

US 2023/0101676 A1   Mar. 30, 2023

Related U.S. Application Data

(63) Continuation of application No. 16/686,011, filed on Nov. 15, 2019, now Pat. No. 11,538,652.

(51) Int. Cl.
  *H01J 37/02*  (2006.01)
  *H01J 37/28*  (2006.01)
  *H02N 2/06*   (2006.01)

(52) U.S. Cl.
  CPC .......... *H01J 37/023* (2013.01); *H01J 37/28* (2013.01); *H02N 2/062* (2013.01); *H01J 2237/20235* (2013.01); *H01J 2237/20264* (2013.01); *H01J 2237/20285* (2013.01); *H01J 2237/2802* (2013.01)

(58) Field of Classification Search
  CPC ...................... H01J 37/023; H01J 37/28; H01J 2237/20235; H01J 2237/20264; H01J 2237/20285; H01J 2237/2802
  See application file for complete search history.

(56) References Cited

U.S. PATENT DOCUMENTS

| 6,977,461 B2 | 12/2005 | Hendricks et al. |
| 7,791,043 B2 | 9/2010 | Seya et al. |
| 11,538,652 B2 * | 12/2022 | Verschueren ........... H01J 37/28 |

(Continued)

FOREIGN PATENT DOCUMENTS

| CN | 103346692 | 10/2013 |
| CN | 106707760 | 5/2017 |
| CN | 107544241 | 1/2018 |
| CN | 107544241 A * | 1/2018 |
| EP | 0457317 A1 | 11/1991 |
| EP | 0457317 B1 | 11/1997 |
| EP | 2973981 | 5/2018 |

(Continued)

OTHER PUBLICATIONS

Yang et al., "Design and Control of a Multi-DOF Micromanipulator Dedicated to Multiscale Manipulation", Smart Mater. Struct. 26 (2017) 115016 (25pp)), (Year: 2017).*

(Continued)

*Primary Examiner* — David E Smith
(74) *Attorney, Agent, or Firm* — Klarquist Sparkman, LLP

(57) ABSTRACT

A positioning system can include a drive unit having an actuator element and a control system. The actuator element can include a piezoelectric material. The control system can be configured to select a path between a first position and a second position, identify at least one change of direction of the actuator element along the selected path, generate a hysteresis-compensated drive signal based at least in part on the change in direction, and apply the hysteresis-compensated drive signal to the actuator element to move an object along the path.

20 Claims, 22 Drawing Sheets

(56) References Cited

U.S. PATENT DOCUMENTS

| | | |
|---|---|---|
| 2001/0011707 A1 | 8/2001 | Visscher |
| 2002/0021428 A1 | 2/2002 | Nakano et al. |
| 2005/0151446 A1 | 7/2005 | Marie Hendriks et al. |
| 2008/0211349 A1 | 9/2008 | Seya et al. |
| 2008/0277582 A1 | 11/2008 | Shi et al. |
| 2009/0236540 A1 | 9/2009 | Seya et al. |
| 2013/0146766 A1 | 6/2013 | Ohshima et al. |
| 2016/0133437 A1 | 5/2016 | Moers et al. |
| 2016/0221197 A1 | 8/2016 | Claffee et al. |
| 2017/0125209 A1 | 5/2017 | De Boeij et al. |
| 2019/0311877 A1 | 10/2019 | Willis et al. |

FOREIGN PATENT DOCUMENTS

| | | |
|---|---|---|
| JP | 859184442 A | 10/1984 |
| JP | S62119847 A | 6/1987 |
| JP | H06207891 A | 7/1994 |
| JP | 2009189216 A | 8/2009 |
| WO | 2018/024416 A1 | 2/2018 |

OTHER PUBLICATIONS

Liu et al., "KP Model for Hysteresis of Piezoelectric Ceramic Actuators", 2015 Chinese Automation Congress, IEEE, 2015, p. 253-257 (Year: 2015).*

Croft et al., "Creep, Hysteresis, and Vibration Compensation for Piezoactuators: Atomic Force Microscopy Application," Proceedings of the American Control Conference 3: 2123-2128, Jun. 2000.

Extended European Search Report dated Apr. 14, 2021, issued by the European Patent Office in EP Application No. 20206831.8, 11 pages.

European Partial Search Report dated Sep. 7, 2021, issued by the European Patent Office in EP Application No. 20206830.0, 15 pages.

Kang et al., "Development of compact high precision linear piezoelectric stepping positioner with nanometer accuracy and large travel range," Review of Scientific Instruments, 78.7: 75112, Jul. 2007 (8 pages).

Liu and Zhou, "KP Model for Hysteresis of Piezoelectric Ceramic Actuators," Chinese Automation Congress (CAC), IEEE: 253-257, Nov. 2015.

Merry et al., "Using a Walking Piezo Actuator to Drive and Control a High-Precision Stage," IEEE/ASME Transactions on Mechatronics, 14(1): 21-31, 2009, (11 pps).

Micky Rakotondrabe; "Classical Prandtl-Ishlinskii Modeling and Inverse Multiplicative Structure to Compensate Hysteresis in Piezoactuators"; FEMTO-st Institute, UMR CNRS-6174 / UFC / ENSMM / UTBM; Automatic Control and Micro-Mechatronic Systems department (AS2M department); 25000 Besançon—France (6 pps).

Yang et al., "Design and control of a multi-DOF micromanipulator dedicated to multiscale micromanipulation," Smart Mater Struct. 26: 115016, 2017 (25 pages).

* cited by examiner

SYSTEMS AND METHODS OF HYSTERESIS COMPENSATION

CROSS REFERENCE TO RELATED APPLICATION

The present application is a continuation of U.S. application Ser. No. 16/686,011 filed Nov. 15, 2019, which is incorporated herein by reference in its entirety.

FIELD

The present disclosure relates to systems and methods of controlling actuators, such as piezoelectric actuators, to compensate for hysteresis.

BACKGROUND

Piezoelectric actuators are well-suited to applications requiring high stiffness, low drift, fast response times, and the ability to produce relatively large forces. However, piezoelectric materials are known to exhibit a significant amount of hysteresis. This can pose a significant barrier to the use of piezoelectric actuators in applications such as semiconductor processing and electron microscopy in which samples and/or tools must be moved and positioned with a high degree of accuracy and a minimum of disturbance. Accordingly, a need exists for improvements to systems and methods of controlling piezoelectric actuators.

SUMMARY

The present disclosure concerns control systems and methods for controlling actuators, such as piezoelectric actuators, to compensate for hysteresis. In a representative embodiment, a method comprises selecting a path between a first position and a second position, and applying a drive signal that includes a hysteresis-compensated portion to an actuator element to move an object along the selected path.

In any or all of the disclosed embodiments, the method further comprises identifying at least one change of direction of the actuator element along the selected path, wherein the hysteresis-compensated portion is based in part on the change in direction.

In any or all of the disclosed embodiments, the change in direction is identified based on a sign of a rate of change of the drive signal.

In any or all of the disclosed embodiments, the drive signal varies between a first value and a second value to move the object along the selected path, and the hysteresis-compensated portion of the drive signal changes when the sign of the rate of change of the drive signal changes.

In any or all of the disclosed embodiments, the hysteresis-compensated portion is based on a hysteresis model of the actuator element.

In any or all of the disclosed embodiments, the hysteresis model of the actuator element comprises an equation of position of the actuator element when actuated between the first position and the second position by an uncompensated drive signal.

In any or all of the disclosed embodiments, the method further comprises determining an inverse equation of the hysteresis model, wherein the hysteresis-compensated portion of the drive signal is based at least in part on the inverse equation.

In any or all of the disclosed embodiments, the method further comprises determining the hysteresis model of the actuator element.

In any or all of the disclosed embodiments, determining the hysteresis model further comprises determining a higher-order polynomial based at least in part on a predetermined hysteresis parameter of the actuator element.

In any or all of the disclosed embodiments, motion of the object along the selected path is linear or rotational.

In any or all of the disclosed embodiments, the actuator element comprises a piezoelectric material, and the drive signal comprises a voltage signal.

In another representative embodiment, a positioning system comprises a drive unit comprising an actuator element, and a control system configured to select a path between a first position and a second position, generate a hysteresis-compensated drive signal, and apply the hysteresis-compensated drive signal to the actuator element to move an object along the path.

In any or all of the disclosed embodiments, the control system further comprises a processor and a memory unit in communication with the processor, the memory unit storing data of a hysteresis model of the actuator element, and the processor is configured to generate the hysteresis-compensated drive signal based on the hysteresis model of the actuator element.

In any or all of the disclosed embodiments, the control system further comprises a processor and a memory unit in communication with the processor, the memory unit storing data of hysteresis compensation signals, and the processor is configured to generate the hysteresis-compensated drive signal based on the hysteresis compensation signals.

In any or all of the disclosed embodiments, the processor is configured to identify at least one change of direction of the actuator element along the selected path, select a hysteresis compensation signal from the memory unit based on the at least one change of direction, and generate the hysteresis-compensated drive signal based on the selected hysteresis compensation signal.

In any or all of the disclosed embodiments, the control system further comprises a signal generator configured to generate a drive signal for the actuator element, and the processor is configured to identify the at least one change of direction based on a sign of a rate of change of the drive signal.

In any or all of the disclosed embodiments, the control system further comprises a lookup table comprising a plurality of predetermined hysteresis-compensated drive signals.

In any or all of the disclosed embodiments, the actuator element is a piezoelectric shear element, the drive unit further comprises a piezoelectric clamp element, and the positioning system further comprises a mover element coupled to a carrier element configured to hold the object, the mover element being engaged with the drive unit and movable relative to the drive unit to position the object along the path.

In another representative embodiment, a scanning transmission electron microscope comprises the positioning system of any of the disclosed embodiments.

In another embodiment, a method comprises applying a drive signal to move an actuator element between a first position and a second position, determining a hysteresis model of the actuator element based on motion of the actuator element between the first position and the second position, determining a hysteresis compensation signal based on the hysteresis model, applying the hysteresis compensation signal to the drive signal to generate a hysteresis-compensated drive signal, and applying the hysteresis-compensated drive signal to the actuator element to move an object along a selected path.

In any or all of the disclosed embodiments, determining the hysteresis model further comprises determining a higher-order polynomial based at least in part on a predetermined hysteresis parameter of the actuator element.

In another representative embodiment, a system comprises a scanning transmission electron microscope, a positioning system comprising a mover element and a drive unit configured to engage the mover element and move the mover element relative to the drive unit to position a workpiece with respect to the scanning transmission electron microscope, the drive unit comprising an actuator element, and a processor configured to select a path between a first position and a second position and apply a hysteresis-compensated drive signal to an actuator element to move the mover element along the selected path.

The foregoing and other objects, features, and advantages of the disclosed technology will become more apparent from the following detailed description, which proceeds with reference to the accompanying figures.

DETAILED DESCRIPTION

The present disclosure concerns positioning systems for precisely positioning a workpiece relative to an instrument, and control methodologies for such systems. The systems described herein can allow a workpiece (a semiconductor wafer or biological sample) to be precisely positioned with respect to one or more tools (e.g., a scanning electron microscope (SEM), transmission electron microscope (TEM), ion column, laser beam, etc.) in a process chamber where, according to the constraints of the system, the tools and/or the workpiece may be positioned at various angles. More particularly, systems and methods are provided herein that allow for compensation of hysteresis in actuator elements, such as piezo actuators, or other actuators with components that move along an axis. By approximating the lag in position due to hysteresis of the actuator element, the drive signal applied to the actuator element can be modified to compensate for the hysteresis. For example, in certain embodiments, the drive signal of the actuator element can be modified based at least in part on the inverse of the path traced by the actuator element when no hysteresis compensation is applied. As used herein, the "inverse" of an equation or function refers to the mathematical inverse $f^{-1}(f(x))$ of a function $f(x)$, where the inverse function $f^{-1}(f(x))$ mirrors or inverts the graph of the function $f(x)$ about an axis. Using such processes, it is possible to repetitively operate a piezo actuator in a stepping or walking drive unit to position a mover element driven by the drive unit with precision on the order of $10^{-9}$ m. It is also possible to reduce or eliminate perturbations in the position and velocity of the mover element during operation.

In the following, systems and methods are described in the context of semiconductor processing or the preparation and analysis of biological samples. However, the position systems, methods, actuators, and actuator controls described herein can be used in other fields where precise positioning and/or speed control are needed.

Example 1: Multi-Beam Systems with Hysteresis Compensation

Figure 1:
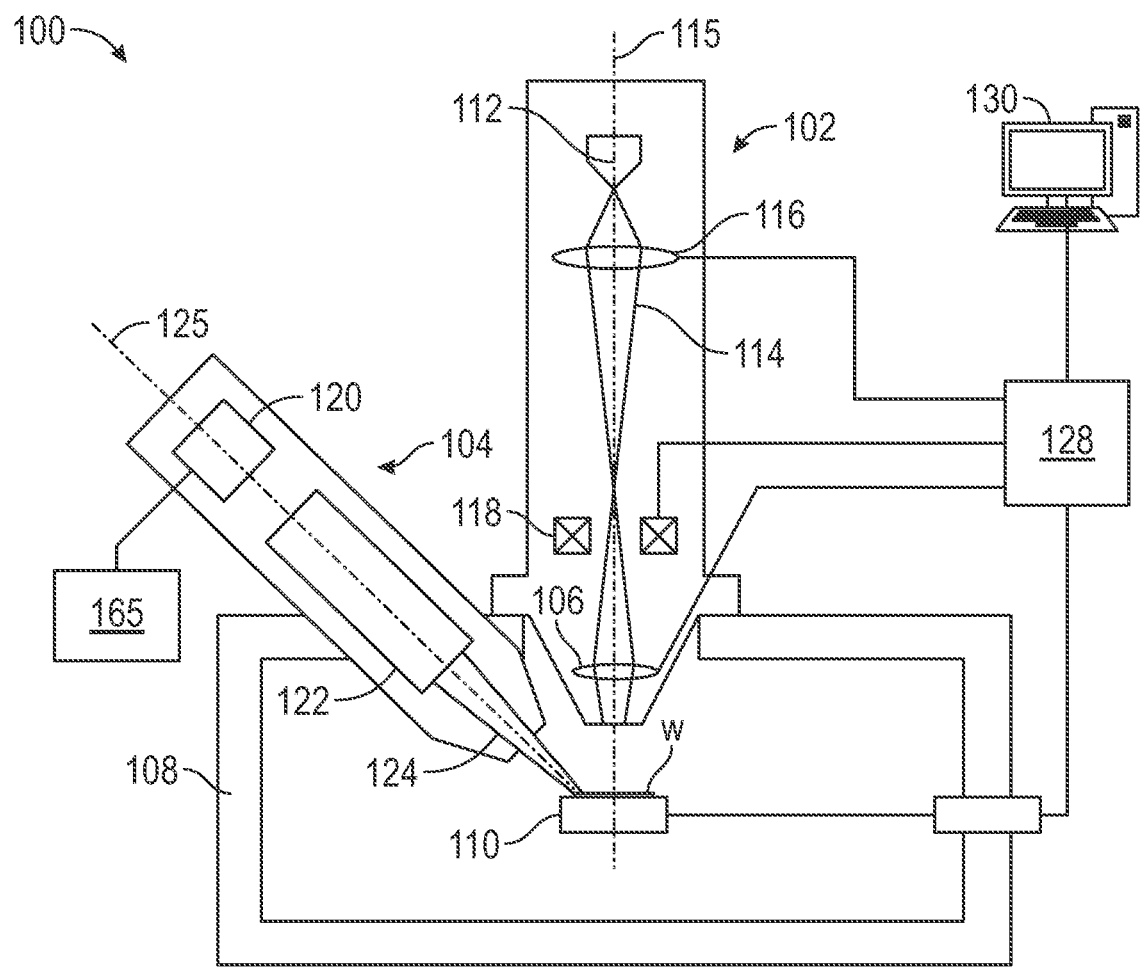
FIG. 1 illustrates a representative embodiment of a multibeam system.

Referring to FIG. 1, in a representative embodiment, a multi-beam system can be configured as a dual-beam system 100 comprising a scanning electron microscope (SEM) generally indicated at 102 and an ion beam column generally indicated at 104. The SEM 102 can comprise one or more charged particle beam (CPB) lenses such as a condenser lens 116 and an objective lens 106. In some embodiments, one or more CPB lenses can be magnetic lenses, and particularly, the objective lens 106 can be a magnetic objective lens. The ion beam column is arranged to provide a focused ion beam (FIB) to a workpiece W, and the SEM 102 is situated for production of an image of the workpiece W.

The SEM 102 and the ion beam column 104 can be mounted to a vacuum chamber 108 housing a positioning system 110 for holding and moving the workpiece W as needed. The vacuum chamber 108 can be evacuated using vacuum pumps (not shown). As discussed in further detail below, the positioning system 110 can be move the workpiece W along the X-, Y-, and/or Z-axes as shown with respect to a coordinate system 150, wherein the Y-axis is perpendicular to the plane of the page, or rotate the workpiece W about one or more axes. In many practical examples, linear motion of the workpiece W in directions orthogonal to an ion beam axis or an electron beam axis is needed, and hysteresis compensation is provided to at least the actuators associated with such translations.

In some embodiments, the SEM 102 can be arranged vertically above the workpiece W and can be used to image the workpiece W, and the ion beam column 104 can be arranged at an angle and can be used to machine and/or process the workpiece W. FIG. 1 shows an exemplary orientation of the SEM 102 and the ion beam column 104.

The SEM 102 can comprise an electron source 112 and can be configured to manipulate a "raw" radiation beam from the electron source 112 and perform upon it operations such as focusing, aberration mitigation, cropping (using an aperture), filtering, etc. The SEM 102 can produce a beam 114 of input charged particles (e.g., an electron beam) that propagates along a particle-optical axis 115. The SEM 102 can generally comprise one or more lenses (e.g., CPB lenses) such as the condenser lens 116 and the objective lens 106 to focus the beam 114 onto the workpiece W. In some embodiments, the SEM 102 can be provided with a deflection unit 118 that can be configured to steer the beam 114. For example, the beam 114 can be steered in a scanning motion (e.g., a raster or vector scan) across a sample being investigated or a workpiece to be processed.

The dual-beam system 100 can further comprise a computer processing apparatus and/or a controller 128 for controlling, among other things, the deflection unit 118, charged particle beam (CPB) lenses 106, 116, the positioning system 110, and detectors (not shown), and for displaying information gathered from the detectors on a display unit such as images of a workpiece or portions thereof, position information, or system control data. In some cases, a control computer 130 is provided to establish various excitations, record imaging data, and generally control operation of both the SEM and the FIB.

Referring still to FIG. 1, the ion beam column 104 can comprise an ion source (e.g., a plasma source 120) and ion beam optics 122. In the illustrated embodiment, the ion beam column 104 is a plasma focused ion beam (PFIB), however, in other embodiments, the ion beam column 104 can be a standard focused ion beam (FIB) having a liquid metal ion source (LMIS), or any other ion source compatible with a focused ion beam column. The ion beam column 104 can produce and/or direct the ion beam 124 along an ion-optical axis 125. As mentioned above, the ion column 104 can be used to perform imaging, processing and/or machining operations on the workpiece, such as incising, milling, etching, depositing, etc. Hysteresis-compensated positioning systems can include one or more compensated actuators to provide accurate positioning and speed for imaging or processing.

In embodiments wherein the ion beam is a PFIB, the ion source 120 can be fluidly coupled to a plurality of gases via a gas manifold 165 that includes gas sources coupled by respective valves to the ion source 120. During operation of the ion source 120, a gas can be introduced, where it becomes charged or ionized, thereby forming a plasma. Ions extracted from the plasma can then be accelerated through the ion beam column 104, becoming an ion beam. In other embodiments, the system 100 can comprise one or more lasers, or other types of milling or diagnostic tools.

As mentioned above, such multi-beam systems can comprise a hysteresis-compensated positioning system (e.g., a stage) configured to hold and position the workpiece W. The positioning system can position/move a carrier element in multiple degrees of freedom, including linear movement (e.g., to choose a particular area for analysis on a workpiece) and/or angular or rotational movement (e.g., to achieve a selected angle of the workpiece relative to an instrument). Typically, positioning systems such as the positioning system 110 include one or more hysteresis-compensated piezo actuators as discussed below. In some examples, a controller such as the controller 128 is configured to provide hysteresis-compensated drive signals.

Example 2: Charmed Particle Beam System with Hysteresis Compensation

Figure 2A:
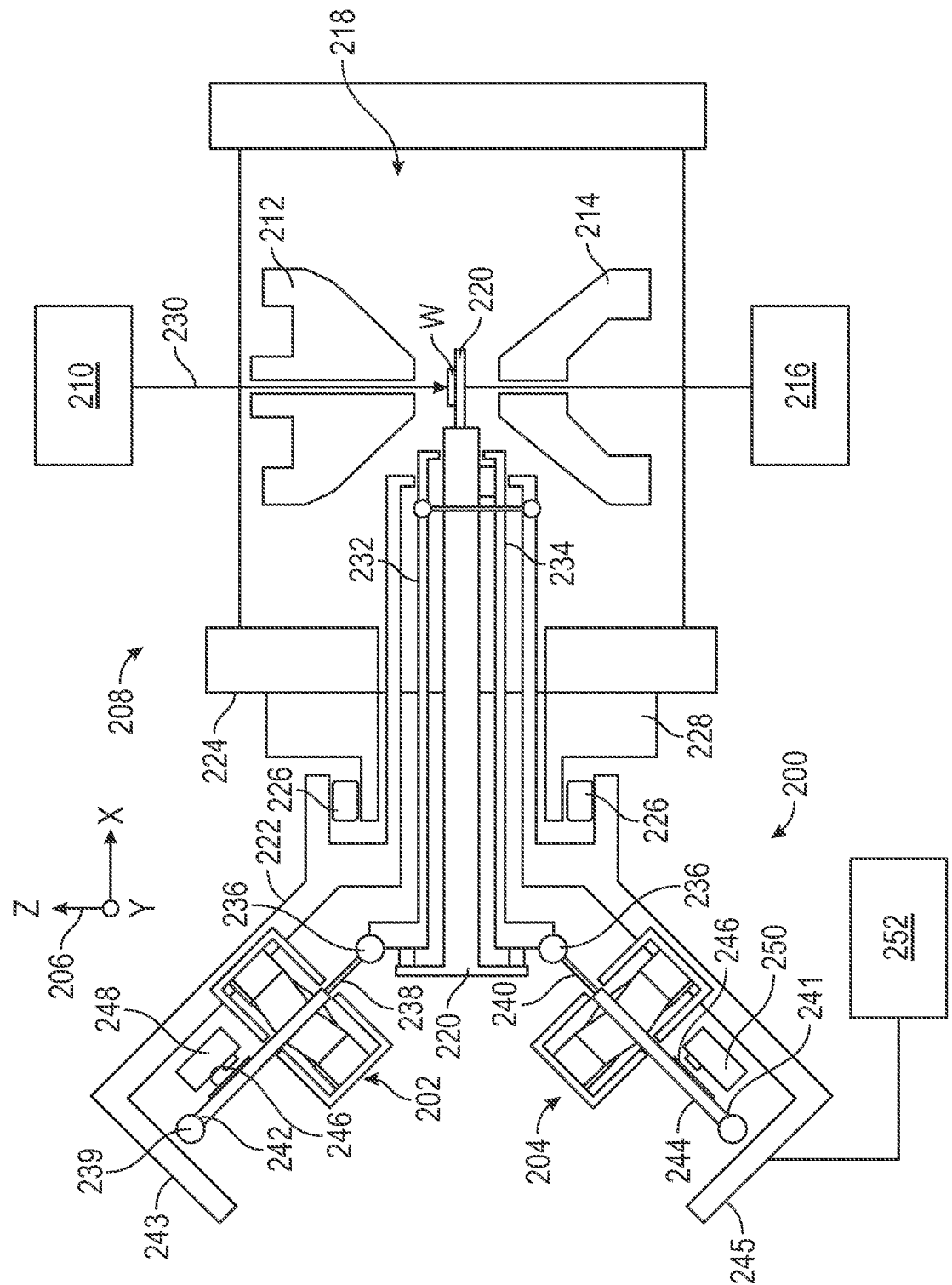
FIG. 2A illustrates a schematic cross-sectional side view of a representative embodiment of a positioning system mounted to the side of an electron microscope system.
Figure 2B:
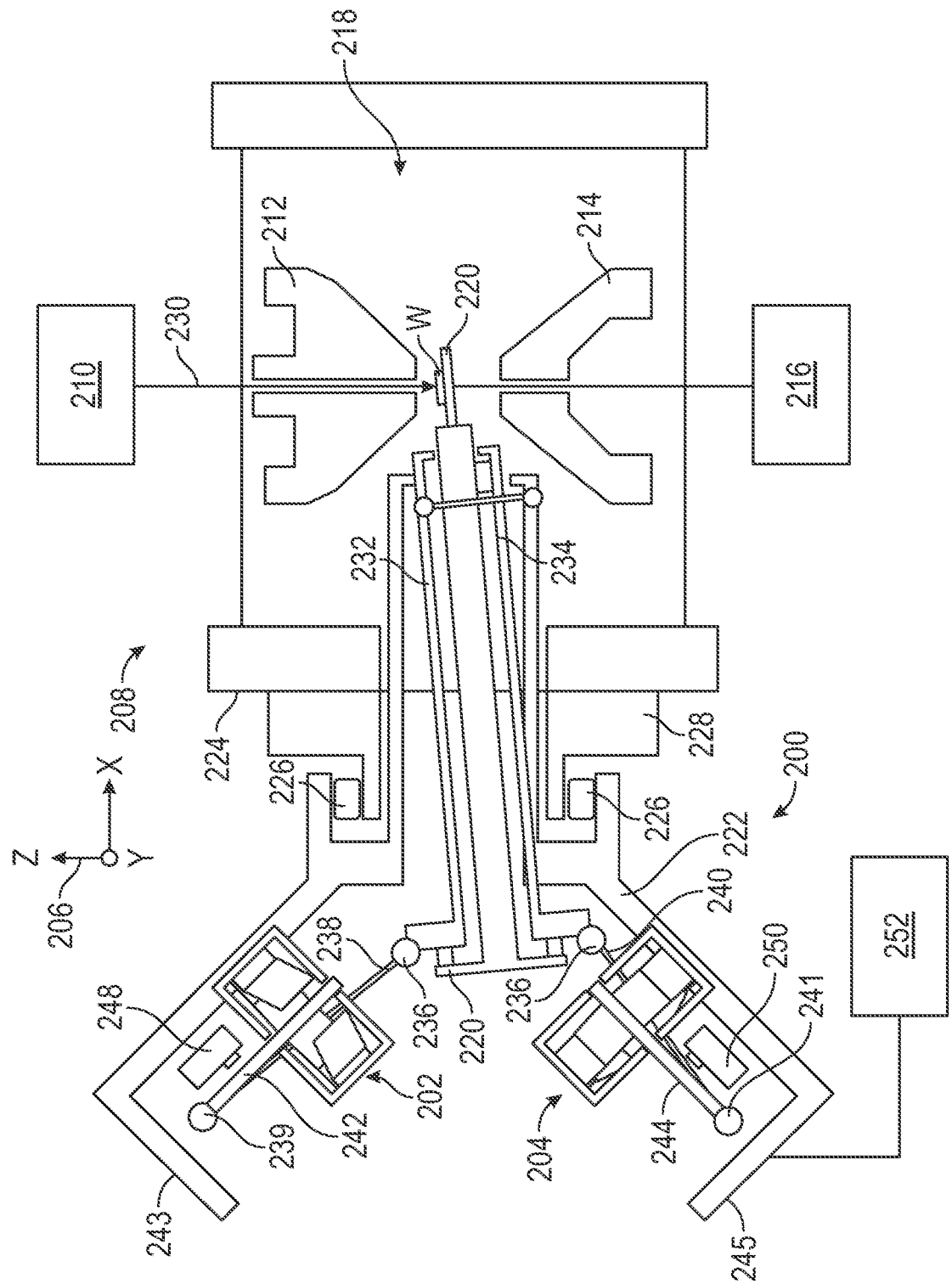
FIG. 2B illustrates the system of FIG. 2A with the workpiece displaced along the z-axis.

FIGS. 2A-2B show cross-sectional views of an exemplary positioning system 200 coupled to a beam system configured as a charged particle microscope (CPM) generally indicated at 208. The positioning system 200 can comprise one or more drive units. For example, in the illustrated embodiment the system can comprise three drive units, of which two drive units 202 and 204 can be seen in FIG. 2A. In the illustrated embodiment, the drive units 202, 204 are configured as walking or stepping piezo drive units, such as Heinmade Piezo Stepper (HMPS) actuators available from Heinmade BV. However, in other embodiments, the drive units can comprise other types of actuators, such as other types of piezo actuators, voice coil motors, rack and pinion systems, linear motors, etc.

The first and second drive units 202, 204 can be configured to position a workpiece W along at least the X- and Z-axes of the coordinate system 206 defined with respect to the beam system 208. As noted above, the positioning system can comprise three or more drive units, allowing for movement of the workpiece along the X-, Y-, and Z-axes or rotation about one or more axes. In some particular embodiments, the positioning system can comprise three drive units oriented such that each drive unit is offset from the others by 120 degrees.

As noted above, the positioning system 200 can be used with multi-beam systems, such as the CPM 208. The CPM 208 can be, for example, a scanning electron microscope (SEM), transmission electron microscope (TEM), or a combination scanning and transmission electron microscope (STEM). The CPM 208 can comprise a beam source 210, an upper pole objective lens 212, a lower pole objective lens 214, an optical or charged-particle beam detector 216 (e.g., a camera, a photomultiplier, photodiode, CMOS detector, CCD detector, photovoltaic cells, etc.). The components can be positioned at least partially within a vacuum chamber 218. The workpiece W is positioned on a carrier element 220 that is shown extending from the positioning system 200 into the vacuum chamber 218.

Positioning system 200 can comprise a frame or housing 222 mounted on an external surface 224 of the CPM 208 (e.g., an external surface of the vacuum chamber 218). The housing 222 can be mounted to the surface 224 using one or more bearings 226, which allow the housing 222 to tilt or rotate (e.g., about the x-axis) relative to the surface 224. In some embodiments, as shown in FIG. 2, the bearings 226 can be coupled to a mounting element 228 disposed on the surface 224 of the CPM 208.

The housing 222 can be disposed such that a portion of the housing comprising the carrier element 220 for holding the workpiece W can extend through an opening in the side of the CPM 208 and at least partially into the vacuum chamber 218. The positioning system 200 can be configured to adjust the position of the workpiece W relative to a charged particle beam 230 by using the drive units (e.g., first and second drive units 202, 204) to adjust the position of the carrier element 220, as described in more detail below.

The carrier element 220 can be coupled to first and second guides 232, 234. Each guide 232, 234 can be further coupled, via respective joints 236 (e.g., a hinge, knuckle joint, ball joint, etc.) to a respective strut 238, 240. The strut 238 can be pivotably coupled to a mover element or member 242 at a pivot joint 239, and the strut 240 can be pivotably coupled to a mover element or member 244 at a pivot joint 241. The first and second drive units 202, 204 can be configured to engage the mover elements 242 and 244, respectively. The drive unit 202 can be configured to move the mover element 242 along its axis toward and away from a rear wall 243 of the housing 222 (e.g., between a first position and a second position) in a series of step motions, as described in greater detail below. The drive unit 204 can be configured to move the mover element 244 along its axis toward and away from a rear wall 245 of the housing 222, similar to the mover element 242. The struts 238, 240 (along with the mover elements and the drive units) can be positioned at an angle relative to one another such that motion of the mover element 242 away from the rear wall 243, along with motion of the mover element 244 toward the rear wall 245 can cause the carrier element 220 to tilt out of the X-Y plane, as shown in FIG. 2B. Simultaneous movement of the mover elements 242 and 244 away from the walls 243 and 245, and toward the CPM 208, can move the carrier element 200 along the X-axis. In the illustrated embodiment, the mover elements 242 and 244 are positioned at an angle of 90°. In certain embodiments, three drive units and corresponding mover elements can be arrayed around the axis of the carrier element 220 with an angular spacing of 120°. As discussed below, the drive units 202, 204 can include piezo actuators that are provided with hysteresis-compensated drive signals.

Each mover element 242, 244 can comprise respective encoder scales 246. First and second position encoders 248 and 250 (e.g., optical encoders) mounted to the housing 222 can be configured to determine the position of each mover element 242, 244, respectively, based on the encoder scales 246. The encoder scales 246 can be coupled to or formed integrally with the movers 242, 244.

Figure 3:
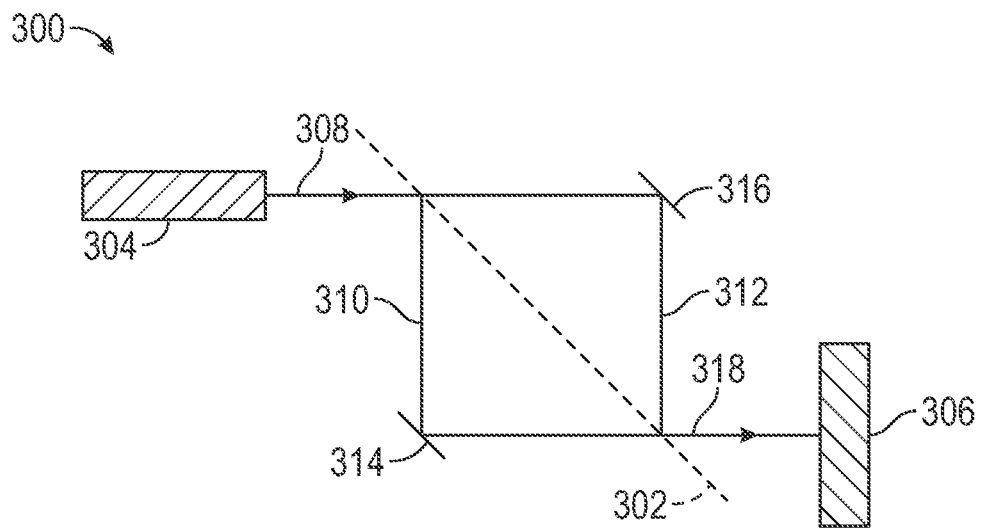
FIG. 3 illustrates a schematic representation of a position encoder, according to one embodiment.

FIG. 3 illustrates a schematic diagram of an exemplary position encoder 300. An encoder scale 302 is mounted to a mover, which can be positioned between a light source 304 and a detector 306. In certain embodiments, the light source and the detector can be mounted to the housing of the positioning system.

As shown, a beam 308 produced by the light source 304 is split into two beams 310, 312 when passing through the encoder scale 302. Two mirrors 314, 316 are used to reunite the beams and direct the united beam 318 into the detector 306.

Referring again to FIG. 2A, each encoder 248, 250 can be configured to determine the position of the respective mover element 242, 244. The location data generated by the encoders 248, 250 can be used by a controller 252 to operate the actuators 202, 204 to position the mover elements 242, 244 at a selected location, thereby positioning the workpiece W at a selected location, as described in more detail below. The positioning system can include one or more piezo actuators in which the disclosed hysteresis compensation systems and methods can be used, and encoders such as the exemplary position encoder 300 can be used to characterize actuator hysteresis and provide position data for compensation and control of hysteresis.

Example 3: Actuator Drive Systems with Hysteresis Compensation

Figure 4A:
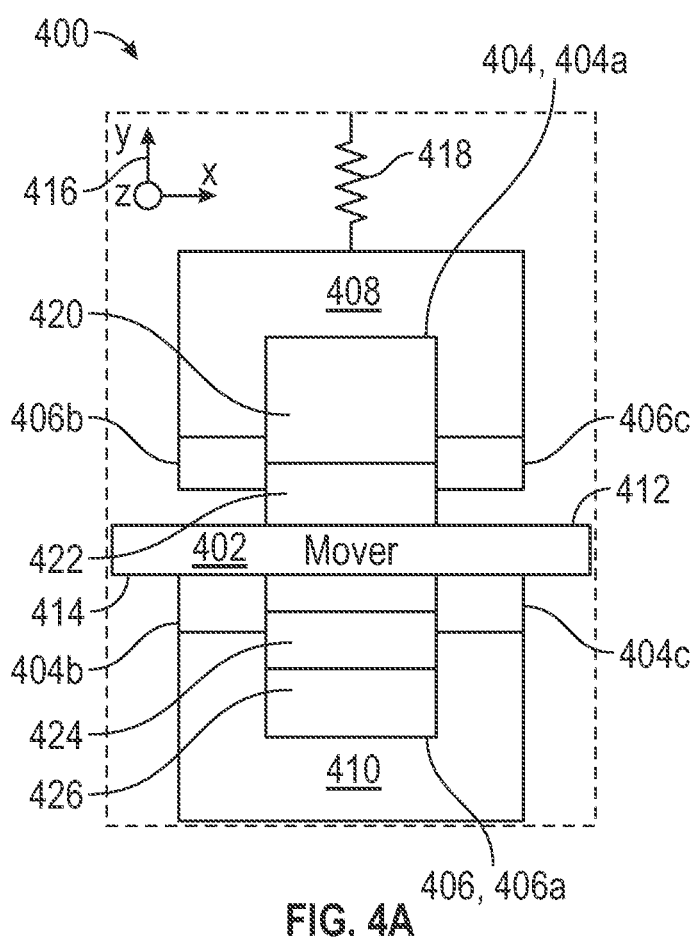
FIG. 4A is a schematic diagram illustrating a front view of a drive unit engaged with a mover element, according to one embodiment.
Figure 4B:
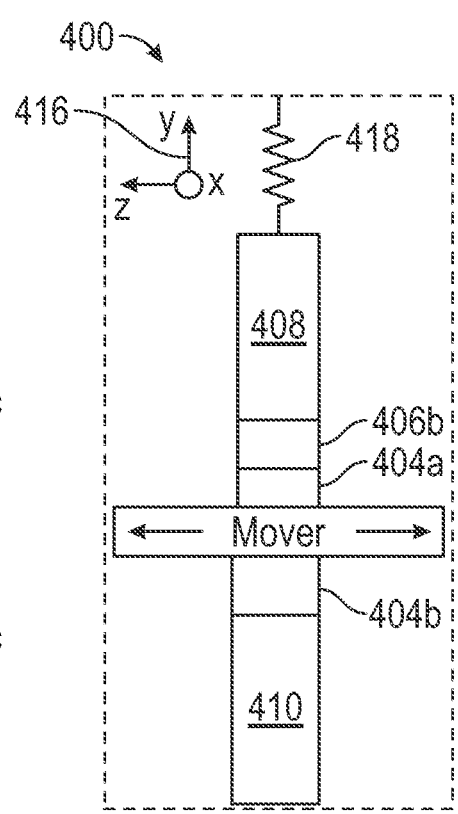
FIG. 4B is a schematic diagram illustrating a side view of the drive unit of FIG. 4B.

FIGS. 4A and 4B illustrate an exemplary drive unit 400 in greater detail, which may be configured for use with the positioning system as either the drive unit 202 or 204. The drive unit 400 can engage a mover member or element 402. As described above, the mover element 402 can be coupled to the carrier element, and can therefore position the workpiece W relative to the CPM 208 or other instruments in the vacuum chamber 218. In the illustrated embodiment, the drive unit 400 can be a piezo drive unit comprising two sets of actuators 404, 406 housed within first and second frame or housing portions 408, 410. For example, in the illustrated embodiment, each actuator set can comprise three movable members, referred to herein as actuators. Each actuator, in turn, can comprise one or more actuator elements, such as a shear element, a clamp element, or various combinations thereof. Each of the actuator elements can be independently movable and/or controllable. In other embodiments, the actuator sets can comprise a greater or fewer number of actuators. Additionally, although in the illustrated embodiments each set of actuators comprises an equal number of actuators, in other embodiments one set of actuators can comprise more or fewer actuators than the other. For example, the first set of actuators can comprise three actuators and the second set of actuators can comprise four actuators, etc. One or more (or all) actuators can be provided with hysteresis compensation.

Returning to FIG. 4A, the first set of actuators 404 can comprise a first actuator 404a disposed adjacent a first surface 412 of the mover element 402, and second and third actuators 404b, 404c disposed on the opposite side of the mover element 402 adjacent a second surface 414 of the mover element. In the illustrated embodiment, the first actuator 404a comprises a shear element 420 and a clamp element 422, and the second and third actuators 404b, 404c comprise shear elements. The clamp and/or shear elements can frictionally engage the mover element 402 in order to move the mover element 402 in a selected direction, as described in more detail below.

The second set of actuators 406 can comprise a first actuator 406a disposed adjacent the second surface 414 of the mover element 402, and second and third actuators 406b, 406c disposed adjacent the first surface 412 of the mover element 402. In the illustrated embodiment, the first actuator 406a comprises a shear element 424 and a clamp element 426, and the second and third actuators 406b, 406c comprise shear elements.

The two sets of actuators 404, 406 can be actuated in an alternating, stepping, or "walking" motion such that when the first set of actuators 404 engages with and exerts force on the mover element 402, the second set of elements 406 disengages or releases the mover element, and vice versa. There can be a brief period between steps when both sets of actuators 404 and 406 are in contact with the mover 402. This is referred to as a "takeover" condition, when one set of actuators "takes over" from the other set of actuators. This configuration, wherein one actuator of a set engages the first surface of the mover element and the second and third actuators of the set engage the second surface of the mover element helps mitigate distortion during operation, and can provide smoother motion of the mover element. The alternating takeover movement between the two sets of actuators advantageously minimizes slipping between the actuators and the mover element. In addition, this configuration allows for an extension of the stroke length of the drive unit without affecting the stiffness or motion performance.

When actuated, the shear elements can be displaced along the Z-axis, as shown with respect to coordinate system 416, wherein the Z-axis is perpendicular to the plane of the page in FIG. 4A and parallel to the plane of the page in FIG. 4B. The clamp elements can be displaced along the Y-axis. A large movement stroke can be achieved by alternating actuation of the sets of actuators.

In some embodiments, the first frame portion 408 can be coupled to a biasing member 418 (e.g., a spring) that allows the first frame portion 408 to move relative to the mover element 402. In use, when an actuator element is energized into an expanded position (e.g., clamp element 420 in FIG. 4A) the first frame portion 408 moves relative to the mover element 402, thereby compressing the biasing member 418. In some embodiments, the biasing member 418 can be biased into an expanded position in order to maintain frictional contact between the actuators housed in the first portion of the frame 408 and the mover element 402.

In some embodiments, the end portions (e.g., the portions adjacent the mover element) of the actuators can be coated with aluminum oxide to mitigate wear on the actuators and to extend the lifetime of the drive unit. In other embodiments, each of the clamp and/or shear elements can comprise a wear resistant plate configured to mitigate damage to the clamp and/or shear elements from frictional engagement with the mover.

Example 4: Clamp and Shear Elements with Hysteresis Compensation

Figure 5A:
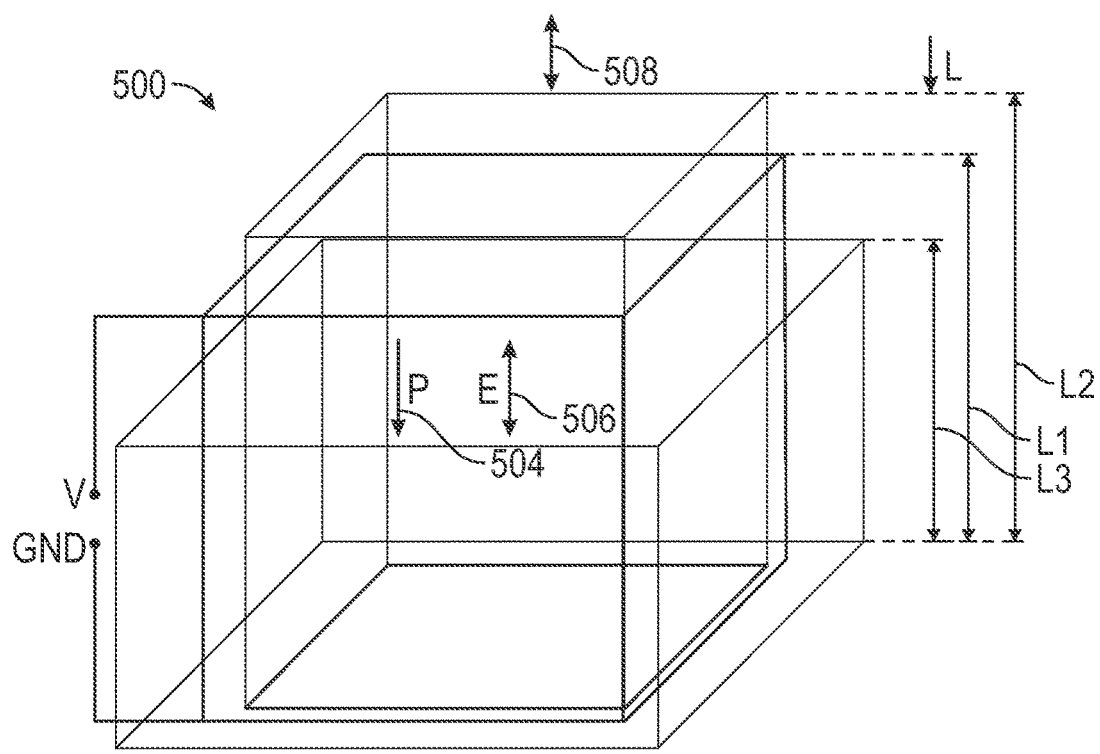
FIGS. 5A-5B are perspective views of a representative embodiment of a longitudinal piezo element.
Figure 5B:
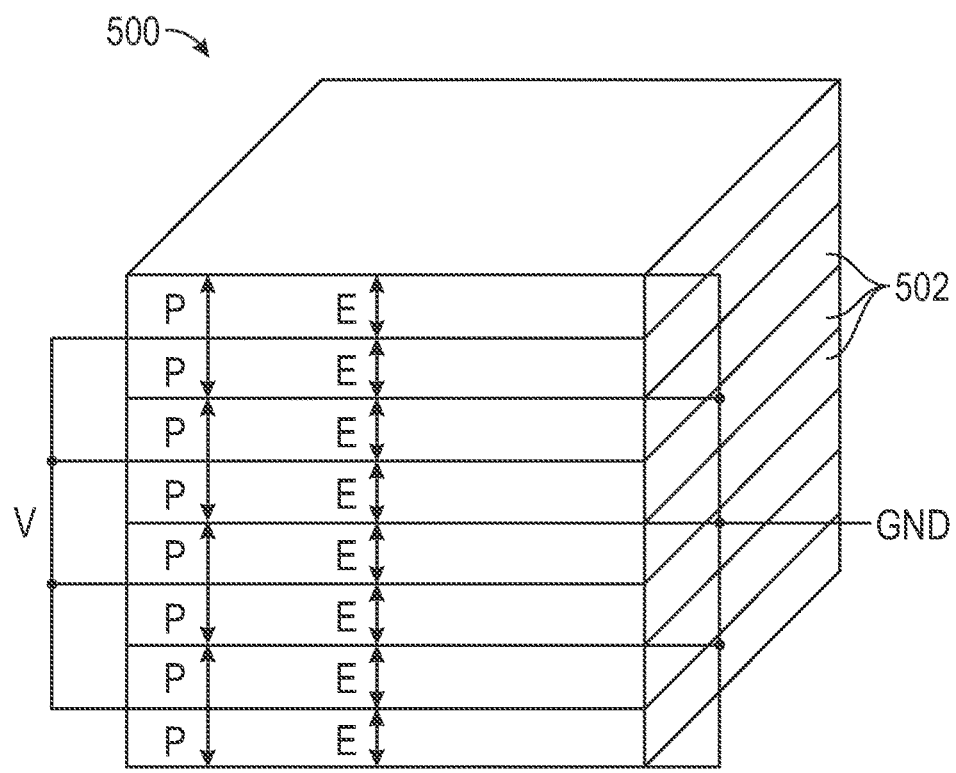
Figure 6A:
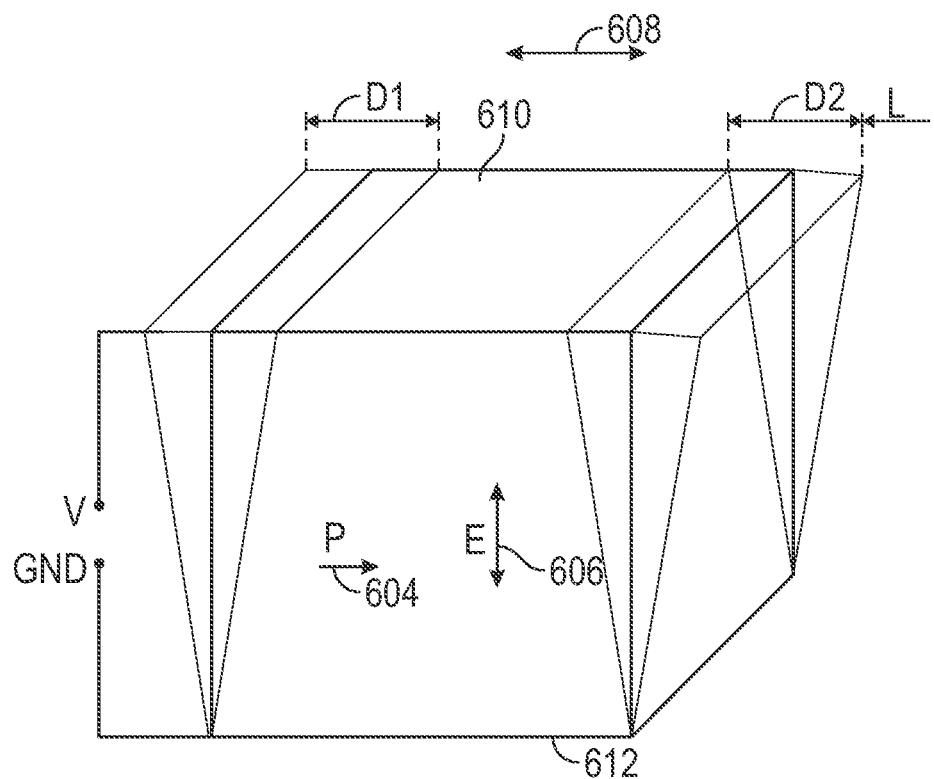
FIGS. 6A-6B are perspective views of a representative embodiment of a shear piezo element.
Figure 6B:
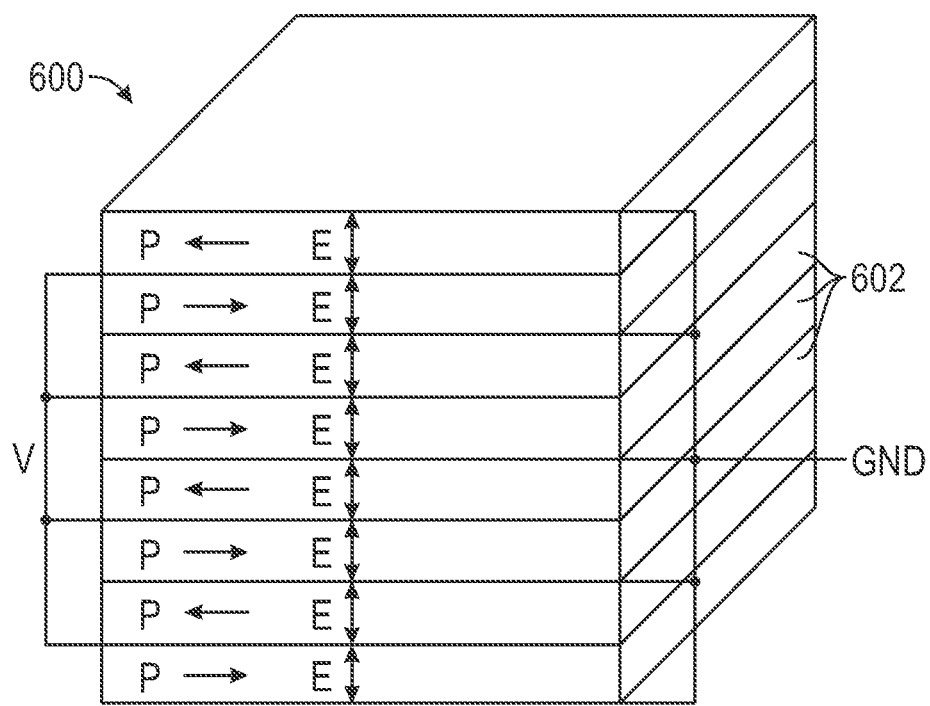

FIGS. 5A-5B show an exemplary embodiment of a piezo device configured as a clamp element 500, and FIGS. 6A-6B show an exemplary embodiment of a piezo device configured as a shear element 600. In the illustrated embodiments, the clamp elements and shear elements comprise piezoelectric elements, one or more of which is hysteresis compensated. Other arrangements of piezo devices can be used, and the examples of FIGS. 5A-6B are selected for convenient illustration. In practice, piezo elements may include other components in addition to the piezoelectric material not shown in FIGS. 5A-5B and 6A-6B, such as housings, supports, mounts, electrical contacts, metallized portions, coatings, etc. Such features are not shown here for ease of illustration.

In certain embodiments, the clamp element 500 can be a longitudinal piezo element and the shear element 600 can be shear piezo element. The longitudinal piezo element 500 can be configured to deform or elongate axially when a voltage is applied, and the shear piezo element 600 can be configured such that one end is laterally displaced with respect to the opposite end when a voltage is applied, as explained in detail below. As shown in FIGS. 5B and 6B, in some embodiments, each element 500, 600 can comprise a plurality of piezoelectric members 502, 602 disposed adjacent to one another. In other embodiments, the clamp and shear elements 500, 600 can be single layer piezo elements, or monolithic multi-layer piezo elements, also called monolithic co-fired piezo elements. In certain embodiments, the displacement of a clamp and/or shear element can be linearly related to the applied voltage. Depending on the way the piezo members 502, 602 are polarized, it can be considered a longitudinal element or a shear element. The clamp elements can move between a first, or neutral configuration, a second elongated configuration (e.g., when energized by applying a positive voltage), and/or a third shortened configuration (e.g., when energized by applying a negative voltage).

For example, as shown in FIG. 5A, the electrical field (shown by arrow 506) can be applied parallel to the direction of polarization (shown by arrow 504). In some embodiments, as shown in FIG. 5B, the clamp element can comprise eight piezo layers, however, in other embodiments, the clamp element can comprise a greater or fewer number of layers. In some particular embodiments, the clamp element can comprise three piezo layers. In some embodiments, the voltage applied to the clamp element can be, for example, between −30 V and 60 V.

When energized (e.g., by applying a positive or negative voltage), the clamp element 500 can expand and/or contract longitudinally, that is, in the direction shown by arrow 508. Referring to FIG. 5A, the clamp element 500 can have a first or neutral configuration having a first or natural length $L_1$ when no voltage is applied to the clamp element, a second or expanded configuration having a second length $L_2$ when a first or positive voltage is applied to the element, and a third or contracted configuration having a third length $L_3$ when a second or negative voltage is applied to the element. The second length $L_2$ can be greater than the first length $L_1$, which can be greater than the third length $L_3$. The length can be based at least in part on the magnitude of the applied voltage.

FIGS. 6A and 6B illustrate an exemplary shear piezo element 600. As shown in FIG. 6A, the electrical field (shown by arrow 606) is applied orthogonally to the direction of polarization (shown by arrow 604). In some embodiments, as shown in FIG. 6B, the shear element 600 can comprise eight layers of piezo members. However, in other embodiments, the shear element can comprise a greater or fewer number of layers. In some particular embodiments, the shear element 600 can comprise four layers of piezo members. In some embodiments, the voltage applied to the shear actuator can be, for example, between −250 V and 250 V.

When energized (e.g., by applying a positive or a negative voltage), a portion of the shear element 600 can shear or move laterally in a selected direction as shown by arrow 608. For example, the shearing motion causes displacement of a first surface 610 of the shear piezo element relative to a second surface 612 on the opposite side of the shear element. The shear element can have a first offset position wherein the first surface is displaced from the second surface in a first direction by a first displacement length $D_1$ when a positive voltage is applied, and a second offset position wherein the first surface is displaced from the second surface in a second direction (e.g., opposite the first direction) by a second displacement length $D_2$ when a negative voltage is applied. The displacement lengths $D_1$ and $D_2$ can be based at least in part on the magnitude of the applied voltage.

The piezoelectric members 502 and 602 can include but are not limited to ceramics (including naturally occurring and synthetic ceramics), crystals (including naturally occurring and synthetic crystals), group III-V and II-VI semiconductors, polymers, organic nanostructures, or any combinations thereof. In some particular embodiments, the piezoelectric elements can comprise lead zirconium titanate (PZT). Such piezoelectric elements can expand when a positive voltage is applied and contract when a negative voltage is applied. The magnitude and speed of contraction, expansion, and/or shear displacement can be dependent on the magnitude of the voltage applied to the piezo members.

Example 5: Hysteresis-Compensated Drive Units

FIGS. 7A-7D show the positions of the actuators of an exemplary drive unit 700 (which can be configured similarly to the drive unit 400) throughout a drive cycle. The drive unit 700 is configured to engage a mover element 702. The drive unit 700 comprises two sets of actuators 704 and 706. Each actuator set can comprise three actuators. For example, the actuator set 704 can comprise actuators 704a, 704b, and 704c, and the actuator set 706 can comprise actuators 706a, 706b, and 706c. The actuators can comprise shear elements, clamp elements, and/or a combination thereof. For example, in the illustrated embodiment, actuators 704b, 704c, 706b, and 706c comprise shear elements. The actuator 704a can comprise a shear element 714 and a clamp element 716, and the actuator 706a can comprise a shear element 718 and a clamp element 720. The actuators can be housed in first and second frame portions 708, 710. In certain embodiments, the displacement of the actuators can be linearly related to the voltage applied. As there are two sets of actuators 704, 706 and each set can comprise two types of elements (clamp and shear), four drive signals can be used to move the sets of actuators 704, 706 in an alternating manner. In some embodiments, the drive signals can be configured as periodic waveforms (e.g., voltage waveforms) due to the repetitive nature of the alternating or walking movement, but in other examples, movement need not be periodic. For either periodic or aperiodic movement, hysteresis compensation as discussed below can be used.

In this example, the actuators 704a and 706a have equal lengths, however, in other examples, the actuators 704a and 706a can have different lengths. In this example, there are two clamp elements 716 and 720 and six shear elements 704b, 704c, 714, 706b, 706c, 718. However, in other examples, a drive unit can comprise a greater or fewer number of clamp and shear elements.

Figure 7A:
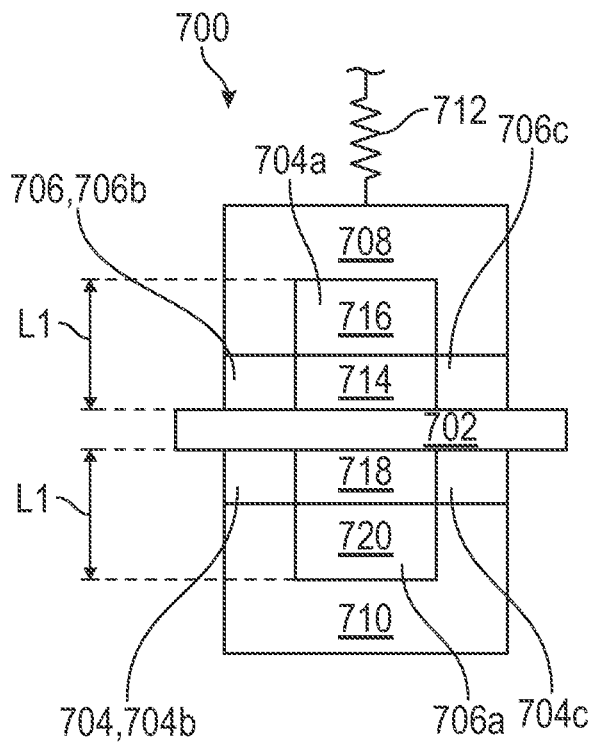
FIGS. 7A-7D illustrate an exemplary drive cycle of an embodiment of a drive unit engaged with a mover element.
Figure 7B:
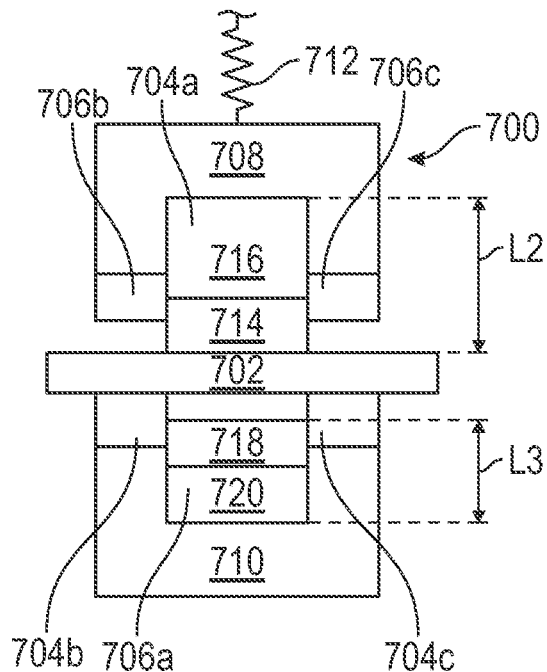
Figure 7C:
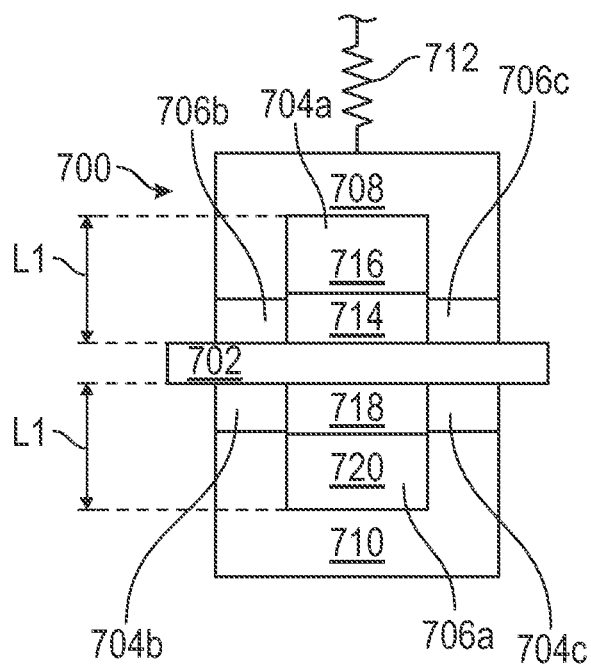
Figure 7D:
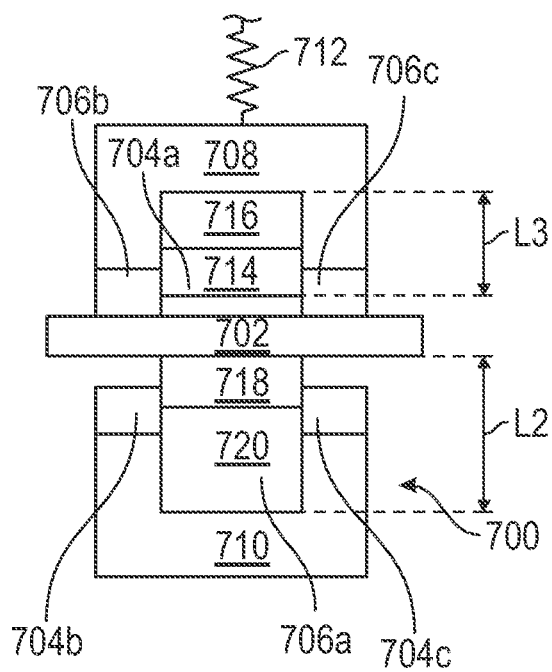
Figure 8A:
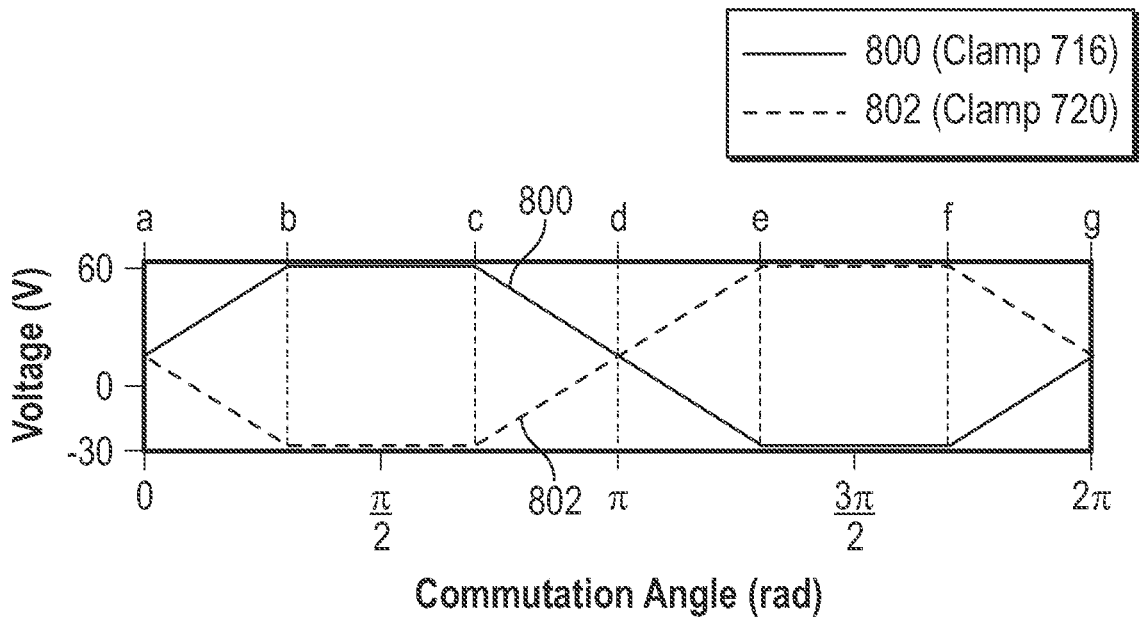
FIG. 8A is a graph of a representative drive signal for the clamp elements of the drive unit of FIGS. 7A-7D.
Figure 8B:
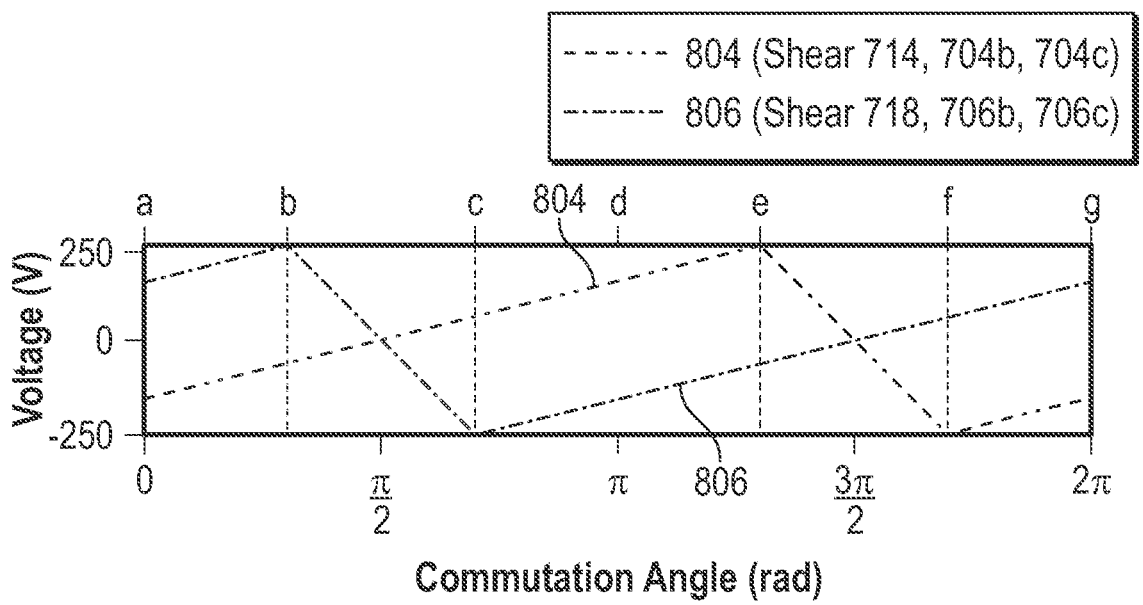
FIG. 8B is a graph of a representative drive signal for the shear elements of the drive unit of FIGS. 7A-7D.

FIGS. 8A and 8B illustrate periodic drive signals for the drive cycle shown in FIGS. 7A-7D. These drive signals are described with reference to a commutation angle $\alpha$ and a period of $2\pi$ radians for illustrative purposes, but can also be described as functions of time and/or position. For convenience in illustrating a drive cycle, the drive signals are shown without compensation. Compensated drive signals are shown explicitly in later examples. Additionally, although the drive signals discussed herein are periodic for convenient presentation, in other embodiments the drive signals can also be aperiodic. The commutation angle $\alpha$ can be defined as:

$$\alpha(t)=2\pi\int_0^t f_\alpha d\tau$$

wherein $f_\alpha$ is the drive frequency of the drive signal and t is time. In this example, an initial value of the commutation angle $\alpha=0$.

FIG. 8A shows an exemplary drive or voltage signal for the clamp elements of the first and second sets of actuators, and FIG. 8B shows an exemplary drive or voltage signal for the shear elements of the first and second sets of actuators. Referring now to FIG. 8A, a first voltage signal 800 can be applied to the clamp element 716 of the first actuator set 704, and a second voltage signal 802 can be applied to the clamp element 720 of the second actuator set 706. The voltage signals in FIG. 8A ramp up and down at a constant rate between −30 V and 60 V. The drive signal of the clamp element 716 can be $\pi$ rad out of phase with the drive signal of the clamp element 720 such that when the voltage applied to the clamp element 716 is 60 V, the voltage applied to the clamp element 720 is −30 V and vice versa. Both signals have the same period, maximum value, and minimum value. However, in other embodiments the drive signal of the clamp element 716 may be different from the drive signal of the clamp element 720.

The voltage signals 804 and 806 in FIG. 8B can increase or ramp up from −250 V to 250 V at a first rate through an angle of $$\frac{3\pi}{2} \text{ rad,}$$

and can decrease or ramp down from 250 V back to −250 V at a second rate over an angle of $$\frac{\pi}{2}$$

rad in the manner of a sawtooth wave. The signals in FIG. 8B can also be out of phase or phase-shifted by $\pi$ rad.

FIG. 7A shows the drive unit 700 in a first or starting position in the drive cycle wherein the commutation angle is zero. This position corresponds with the drive signal values at a commutation angle of 0 rad in FIGS. 8A and 8B, indicated by reference letter a. In FIGS. 7A-7D, displacement of the mover element 702 is out of the plane of the page. As shown in FIG. 8A, the voltage applied to the clamp elements 716 and 720 of the actuators 704a and 706a is equal at 0 rad such that both actuators have an equal length $L_1$, and engage and clamp the mover element 702 between them. Referring to FIG. 8B, the voltage applied to the shear elements of the actuators 704b and 704c, and to the shear element 714 of the actuator 704a, can be −200 V. The voltage applied to the shear elements 706b and 706c, and to the shear element 720 of the actuator 706a, can be 200 V. The actuators 704b, 704c, 706b, and 706c are also in contact with the mover element 702. The position of the actuators in FIG. 7A can correspond to the "takeover" movement wherein all elements of both sets of actuators 704, 706 are in equilibrium with each other and in contact with the mover 702, and before the actuator set 706 disengages from the mover 702. The derivative with respect to the commutation angle of the shear-voltages of the shear elements in both shear groups can be equal. Accordingly, both shear groups can move with the same velocity.

FIG. 7B shows the drive unit in a second exemplary position in the drive cycle, corresponding to the portion of the drive signal shown by reference letters b-c in FIGS. 8A and 8B. The clamp element 716 of the actuator 704a of the first set of actuators 704 is energized with a positive voltage, thus moving the actuator 704a from the first length $L_1$ to an expanded length $L_2$ that is greater than $L_1$. As shown in FIG. 8A, the voltage applied to clamp element 716 of actuator 704a can be 60 V and the voltage applied to the clamp element 720 of actuator 706a can be −30 V. The expanded length $L_2$ of the actuator 704a moves the first frame portion 708 relative to the mover element 702, such that the actuators 706b and 706c no longer engage the mover element 702. The first frame portion 708 can be coupled to a biasing element 712. As the shear element drive signal 804 ramps up between 0 rad and $$\frac{5\pi}{4} \text{ rad,}$$

the shear elements 714, 704b, and 704c displace the mover element 702 relative to the drive unit in a direction out of the page. Meanwhile, between $$\frac{\pi}{4}$$

rad and $$\frac{3\pi}{4} \text{ rad,}$$

the shear elements 718, 706b, and 706c are repositioned to take over from the first actuator set 704 and continue motion of the mover element out of the plane of the page.

The biasing element 712 (e.g., a spring) can compress to allow movement of the first frame portion 708 relative to the mover element 702. The clamp element 720 of the actuator 706a meanwhile is energized with a negative voltage (e.g., −30 V), thus moving the actuator 706a from the first length $L_1$ to a contracted configuration having length $L_3$, smaller than length $L_1$ such that the actuator 706a no longer engages the mover element 702. Actuators 706b and 706c are in position for the next "takeover" movement, while the actuators 704b, 704c, and 714 move, displace, or drive the mover element 702 with respect to the drive unit 700 under the influence of the increasing drive voltage in FIG. 8B. As shown in FIG. 8B, the voltage applied to shear elements 718, 706b, and 706c can drop from 250 V to −250 V and the voltage applied to shear elements 714, 704b, and 704c can rise from −50 V to 50 V.

FIG. 7C shows the actuator in a third exemplary position in the drive cycle, corresponding to the portion of the drive signals indicated by reference letter d in FIGS. 8A and 8B. The third exemplary position is a second "takeover" movement similar to the takeover movement described above with respect to FIG. 7A, in which all of the actuators are in contact with the mover element 702. As shown in FIG. 8A, the voltage applied to the clamp elements 716 and 720 of the actuators 704a and 706a is equal at 0 rad such that both actuators have an equal length $L_1$, and engage and clamp the mover element 702 between them. Referring to FIG. 8B, the voltage applied to the shear elements of the actuators 704b and 704c, and to the shear element 714 of the actuator 704a, can be 200 V. The voltage applied to the shear actuators 706b and 706c, and to the shear element 718 of the actuator 706a, can be −200 V.

FIG. 7D shows the actuator in a fourth exemplary position in the drive cycle, corresponding to the portion of the drive signal shown by reference letters e-f in FIGS. 8A and 8B. This position is similar to the position shown in FIG. 7B, except that the second set of actuators 706 is engaged with the mover element 702 and the first set of actuators 704 are disengaged. The clamp element 720 of the actuator 706a is energized with a positive voltage, thus moving actuator 706a from length $L_1$ to an expanded configuration having length $L_2$ greater than $L_1$. As shown in FIG. 8A, the voltage applied to clamp element 720 of actuator 706a can be 60 V and the voltage applied to clamp element 716 of actuator 704a can be −30 V. The expanded configuration of the actuator 706a can move the mover element 702 (and thereby the elements 704a, 706b, 706c and the first frame portion 708) relative to (e.g., away from) the second frame portion 710, such that actuators 704b and 704c no longer engage the mover element 702. The clamp element 716 is energized with a negative voltage (e.g., −30 V), thus moving the actuator 704a from the first length $L_1$ to a contracted configuration having length $L_3$, smaller than length $L_1$ such that actuator 704a is not engaged with the mover element 702. Actuators 704b and 704c are in position for the next "takeover" movement, while actuators 706b and 706c drive or displace the mover element 702 due to the increasing drive voltage in FIG. 8B. As shown in FIG. 8B, the voltage applied to shear elements 718, 706b, and 706c can rise from −50 V to 50 V and the voltage applied to shear elements 714, 704b, and 704c can drop from 250 V to −250 V.

Because the selected drive signals of the actuator sets are periodic, the configuration of the drive unit corresponding to the portion of the drive signal shown by the reference letter g in FIGS. 8A and 8B is the same as the configuration shown in FIG. 7A. This combination of piezo elements and drive signals enables the drive unit to move the mover element 702 in a series of steps reminiscent of a walking motion. This drive cycle can be repeated as necessary in order to move the mover element 702 to a selected position. The direction of the drive signals can also be reversed in order to move the mover element in the opposite direction.

Example 6: Exemplary Control Systems

As described previously, the drive unit(s) can be used to move the mover(s), thereby positioning the workpiece W relative to a charged particle microscope (CPM), for example, a scanning transmission electron microscope (STEM). Disturbances in the position and velocity of the workpiece W can be undesirable for tracking point to point movements of the workpiece W travelling at constant velocity. For example, disturbances can cause the guidance system to lose track of the positioning of the workpiece and/or a selected area of the workpiece that is meant to be imaged. In some embodiments, the CPM can be configured to image the workpiece W while the workpiece is in motion. In such embodiments, it is particularly advantageous to have smooth and consistent movement of the workpiece W.

Figure 9:
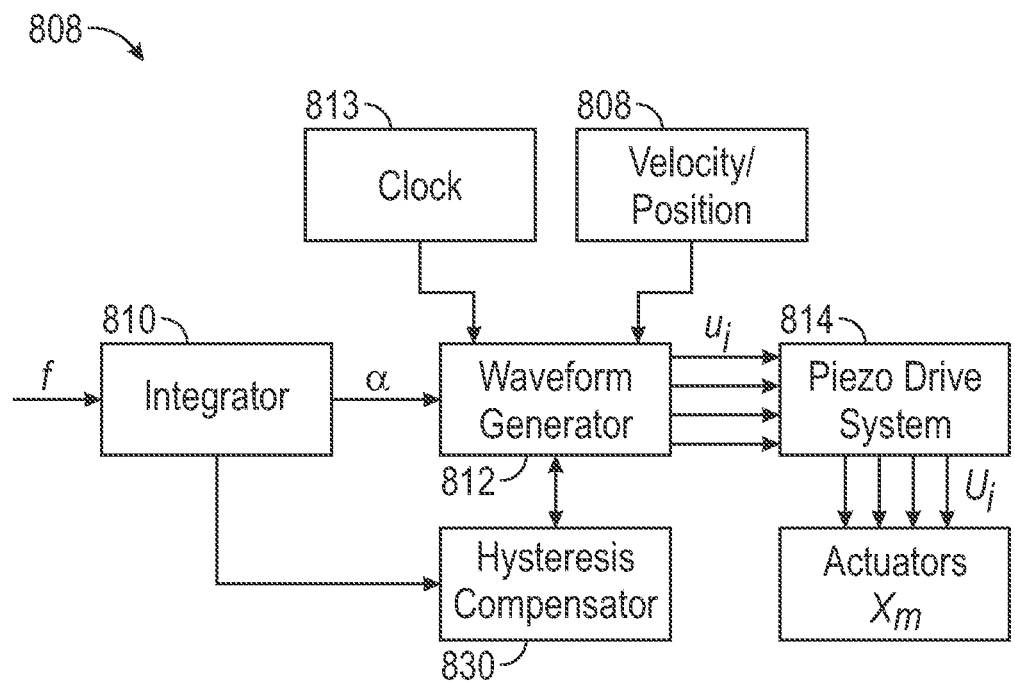
FIG. 9 is a schematic block diagram illustrating a representative embodiment of a control system.

An exemplary control system 808 for producing the drive signals and operating the drive unit in the sequence described above is shown in FIG. 9. The control system 808 can comprise an integrator tool or module 810 and a signal generator module 812. A piezo drive system 814 is coupled to the signal generator module 812 to condition drive signals for application to piezo actuators, typically by adjusting drive signal magnitudes as needed. In the illustrated embodiment, a drive frequency fa or a clock signal from a clock signal generator 813 at the drive frequency can be provided to the integrator module 810 to establish a commutation angle α. In some cases, a digital or other representation of the drive frequency is provided; alternatively, a periodic signal at the drive frequency is provided and used to determine the commutation angle. In other examples, signals associated with movement to a specified position or with a specific velocity are provided as shown at 811. In some examples, a fixed frequency drive is used, and commutation angle as a function of time can be predetermined and stored in a memory such as in a look-up table. As shown in FIG. 9, the integrator module 810 can output a commutation angle α to the signal generator 812, which can generate a plurality of (e.g., four) output voltage signals $u_i$ to the piezo drive system 814 for shear and clamp elements to produce a position change $x_m$ in response to corresponding signals $U_i$ produced by the piezo drive system 814. These signals can be obtained based on digital representations that are applied at a selected frequency and produced using one or more digital to analog convertors. Since there can be two types of piezo elements (e.g., shears and clamps) grouped into, for example, two sets of piezo actuators, the signal generator in this example can output four signal or voltage functions $u_i$ to move the drive unit in the selected manner. The waveform generator 812 can be configured to output any of the voltage signals described herein. Although the control system 808 shown in FIG. 9 is a feed-forward configuration, in certain embodiments any of a plurality of variables such as the position of the actuator elements, their velocity, etc., can be determined and fed back to any of the components, and/or to one or more other control units not shown.

A hysteresis compensation module 830 is coupled to the waveform generator 812 to provide hysteresis compensation adjustments to drive signals from the waveform generator 812. Alternatively, such functionality can be included in the waveform generator 812. Directional changes can be provided based on the commutation angle α received from the integrator 810 or on the waveforms provided to the piezo drive system 814. In some cases, the control system 808 is based on digital signal representations that can be stored in a memory or generated as needed, and a digital to analog convertor is used to produce the drive signals. For walking-type piezo positioners, a series of steps is typically required to move a workpiece to an intended location, and drive signals from the waveform generator are periodic to provide a plurality of steps and each step can be associated with a different hysteresis correction value.

Example 7: Representative Piezo Actuators

The piezoelectric actuators described herein can comprise any of a variety of piezoelectric materials, such as ceramic materials of the perovskite family having the formula $ABO_3$. For example, in certain embodiments the piezoelectric material can comprise lead zirconate titanium (PZT). In particular embodiments, the piezoelectric drive units described herein can be stepper motors.

Figure 10:
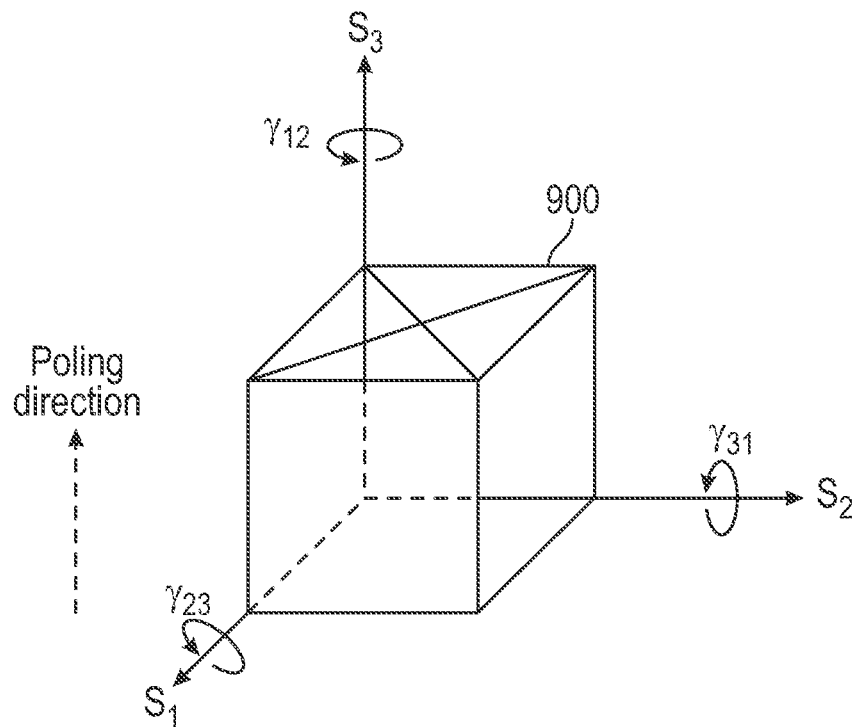
FIG. 10 is a perspective view of a representative embodiment of a longitudinal piezo element.
Figure 11:
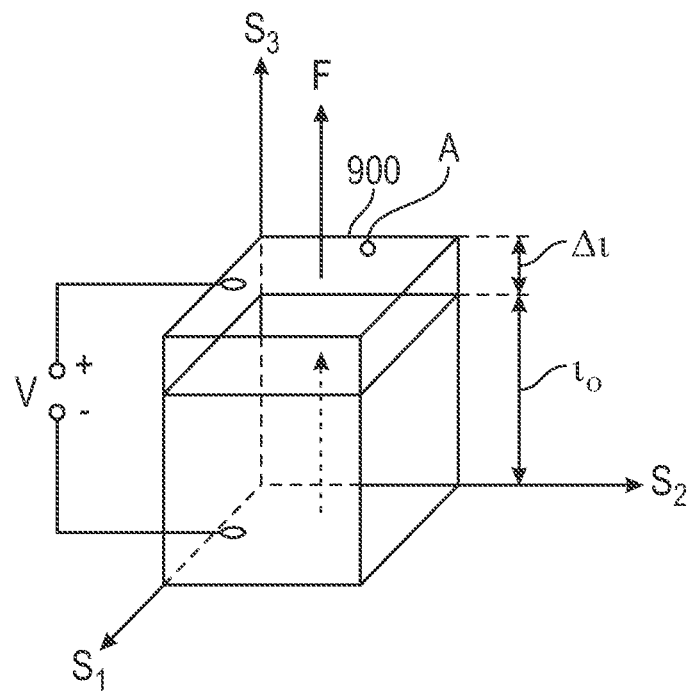
FIG. 11 is a perspective view of the longitudinal piezo element of FIG. 10 in an extended position.
Figure 12:
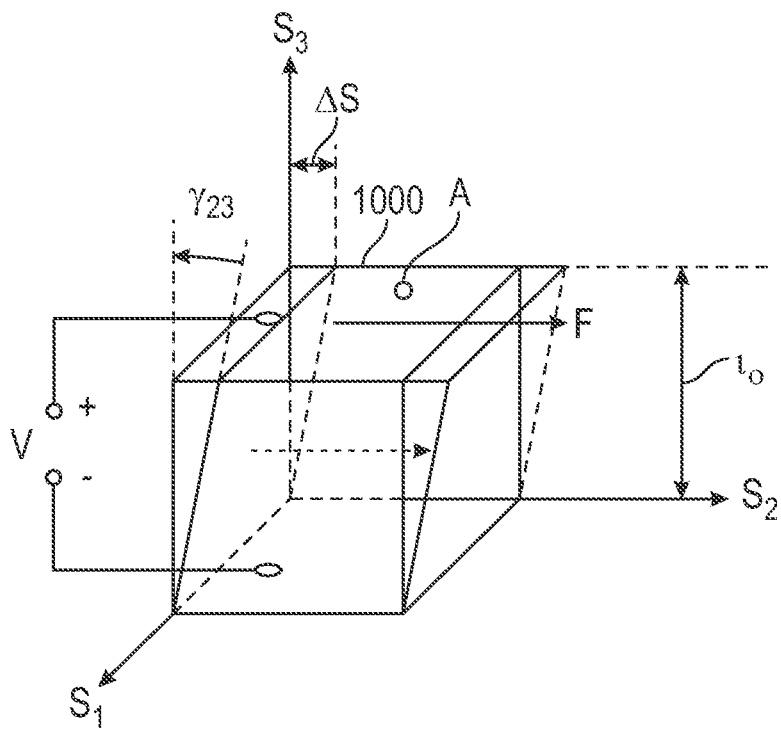
FIG. 12 is a perspective view of a representative embodiment of a shear piezo element deformed into a parallelogram shape by application of an electric field.

FIGS. 10-11 shows an exemplary actuator 900 with a cross-section A, length $l_o$, and polarization in an $s_3$-direction. Thus, the actuator 900 can extend and contract in the $s_3$-direction. FIG. 12 shows a representative example of a shear piezo element 1000 with a cross-section A and length $l_o$, and polarized in the $s_2$-direction. Unlike a piezo-stack element such as the clamping element 900, where the change in length is in the same direction as the applied electrical field, the deformation of the shear element 1000 is orthogonal to an applied electric field. The result is that the shear piezo element 1000 can deform from a square shape into a parallelogram shape in which the side surfaces of the element are rotated about the axis $S_1$ by an angle of $\gamma_{12}$ and the upper surface is displaced from its natural position by an amount $\Delta S$.

Example 8: Hysteresis Compensation

In certain embodiments, hysteresis of the piezo elements can be a significant contributing factor to perturbations observed in the position and/or the velocity of the mover element during operation of the drive unit. The following discussion presents control systems and methods which may be used to reduce or eliminate hysteresis in actuators comprising piezo elements, or other types of actuators having a stroke that extends along an axis.

In certain embodiments, it is possible to at least partially compensate for hysteresis of a piezo element by modifying the voltage waveform inputted to the piezo element. For example, the drive signal waveform can be modified with a function corresponding to the inverse of observed displacement of the piezo element in order to modify the displacement of the piezo element. The following discussion proceeds with reference to a shear element for purposes of illustration. However, the systems and methods described herein can also be used to compensate for hysteresis in clamping elements.

Figure 13A:
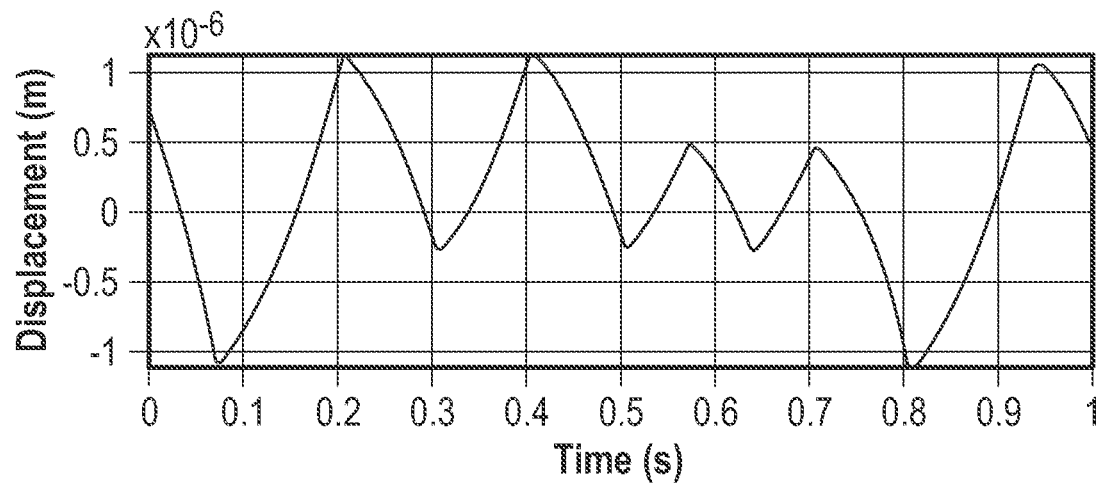
FIG. 13A is a graph of the displacement of a shear piezo element when the voltage signal of FIG. 13B is applied.
Figure 13B:
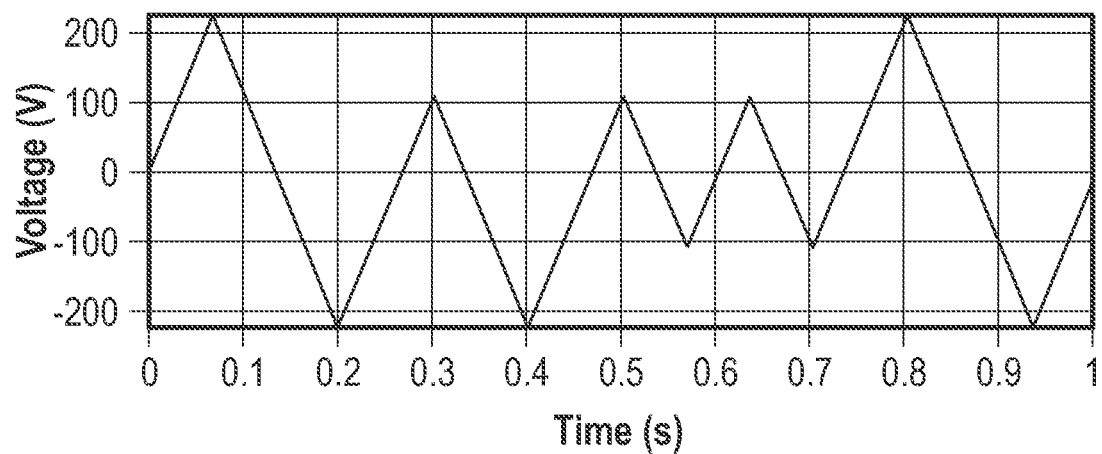
FIG. 13B is a graph of one embodiment of a voltage signal.

In certain embodiments, the displacement of a piezo actuator element can be measured for a given drive voltage or signal. Such measurements can be conducted for actuator elements in assembled drive units in order to determine the effect of the element's position on its stroke and/or displacement. For example, FIG. 13B illustrates one example of a drive signal in the form of a sawtooth wave input voltage alternating between maximum values of −250 V and 250 V, and values in between, at a constant rate or ramp. FIG. 13A illustrates the resulting displacement of a shear piezo element when the alternating voltage is applied as electrical input. For example, in the illustrated embodiment, the position plot of the shear piezo element is curved between changes in direction (corresponding to changes in the direction of the voltage ramp signal). The graph of FIG. 13A shows that there can be a substantial non-linear effect caused by hysteresis of the piezo-material of the shear element. In certain embodiments, the displacement of the shear piezo element can be measured with a position sensor, such as the encoder embodiments described above.

Figure 14:
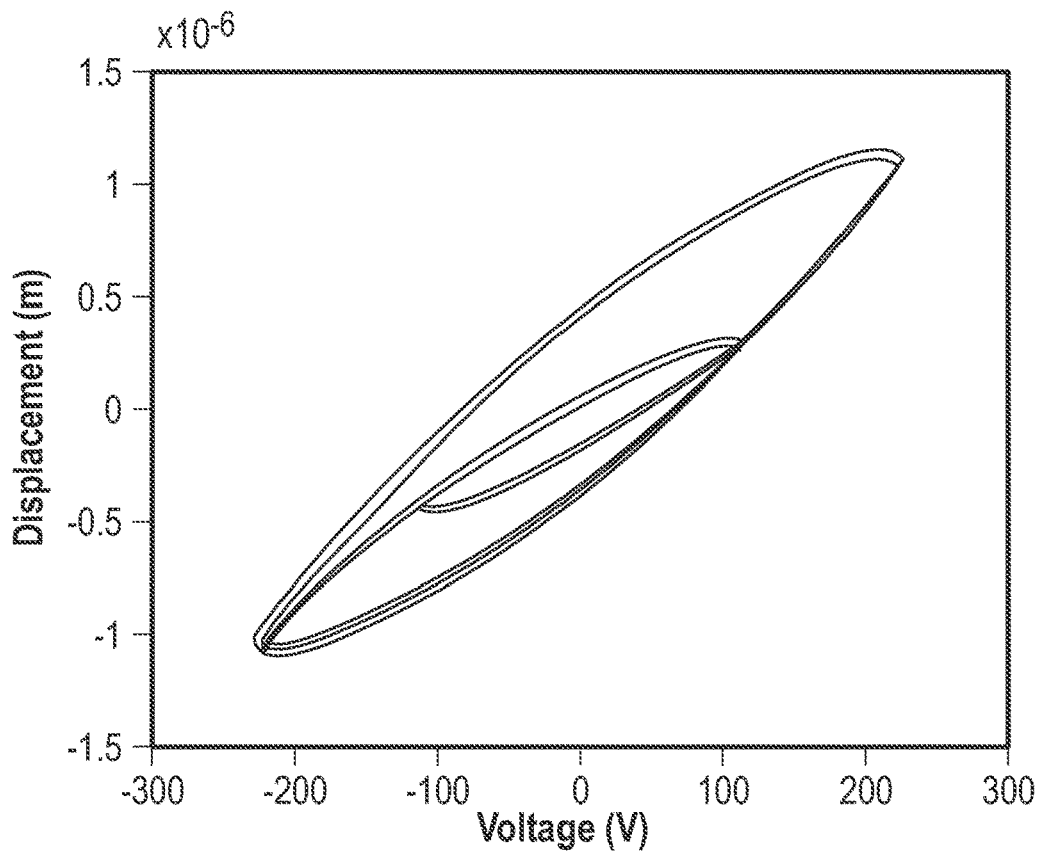
FIG. 14 is a graph of the displacement of a shear piezo element on the y-axis and the applied voltage on the x-axis for the voltage signal of FIG. 13B.

FIG. 14 shows the position or displacement of the shear piezo element on the y-axis and the applied voltage on the x-axis for one example. This illustrates a looping effect in displacement while the applied voltage alternates or ramps between −250V and 250V. In the ideal case, the displacement of the shear element when excited by such a waveform would result in a straight line extending between −250V and 250V independent of the direction of the voltage ramp. Thus, hysteresis of the piezo element can result in a non-linear displacement curve that depends upon the direction of a time-varying voltage signal applied to the element.

Figure 15:
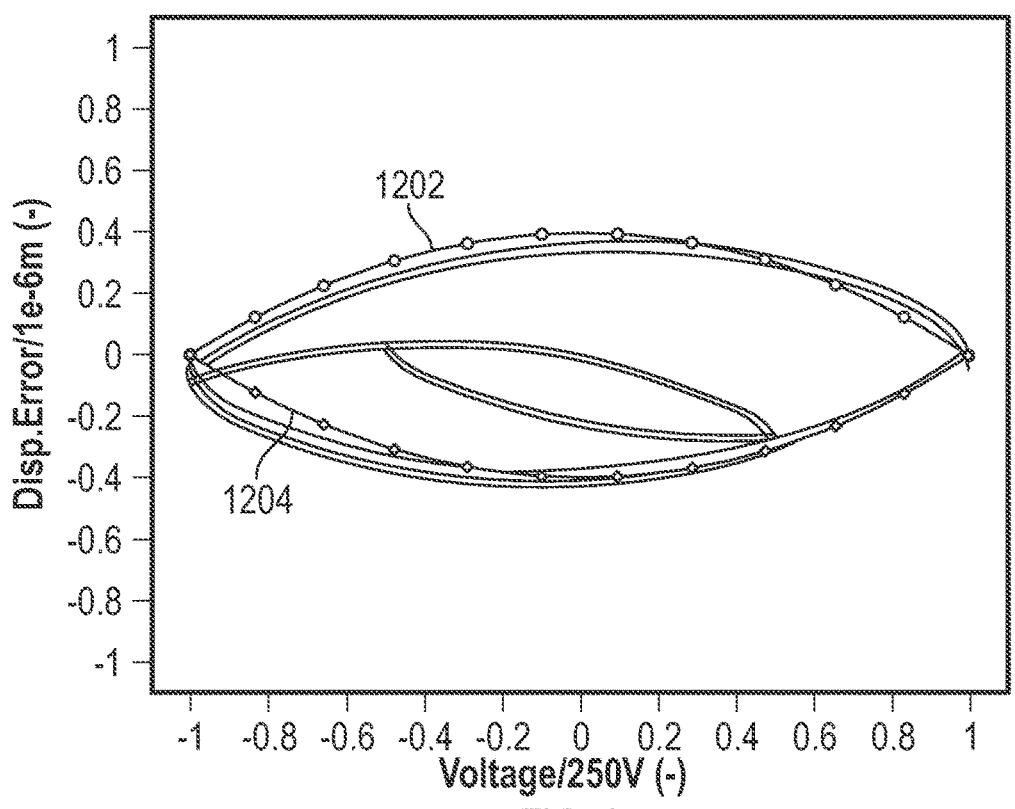
FIG. 15 is a graph of the displacement versus voltage of FIG. 14 including two curves that approximate the displacement of the piezo element for increasing and decreasing voltage.

Referring to FIG. 15, the voltage and displacement in FIG. 14 are scaled with 250 V and $10^{-6}$ m, respectively, to give the displacement error. The slope of the scaled voltage can also be compensated for. Superimposed on FIG. 15 are two curves 1202 and 1204, with the upper curve 1202 outlined with circle symbols and the lower curve 1204 outlined with diamond symbols. In the illustrated example, the upper and lower curves are parabolas which can be approximated as:

$$y_{1202} = 0.4(1-x^2)$$

$$y_{1204} = 0.4(x^2-1) \quad \text{Equation 1}$$

As can be seen in the plot of FIG. 15, the parabolas defined in this way approximate the outer displacement loops. This can be used to provide piezo control systems and methods that modify the applied voltage based on an opposite or inverse parabolic compensation to compensate for hysteresis of the piezo elements. In certain embodiments, such modified voltage signals can result in a linear or nearly linear relationship between the input voltage and the output displacement of the piezo element.

Figure 16:
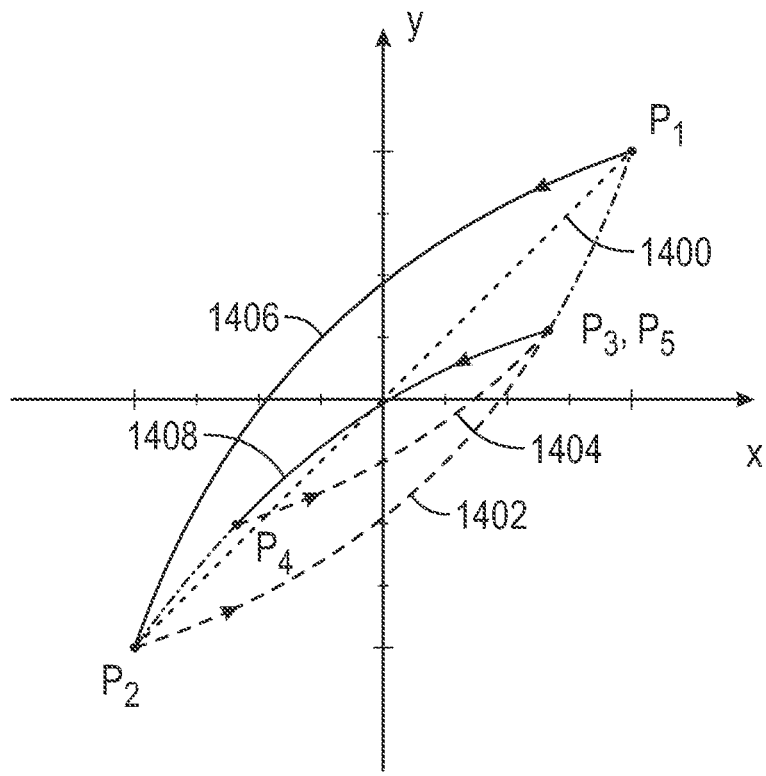
FIG. 16 is a graph showing an approximation between scaled voltage and scaled displacement, where scaled voltage is on the horizontal axis and scaled displacement is on the vertical axis.

FIG. 16 shows how the approximation between scaled voltage and scaled displacement can be accomplished when scaled voltage (x) is changing on the horizontal axis from $P_1$ to $P_2$ to $P_3$ to $P_4$ to $P_5$. In the illustrated example, the points $P_1$ to $P_5$ indicate where the voltage signal changes direction in time. The dashed line 1400 represents the ideal displacement behavior of the piezo element. The concave-up curve 1402 extending between $P_4$ and $P_3$, $P_5$, and the concave-up curve 1404 extending between $P_2$ and $P_1$ illustrate the actual displacement with increasing voltage when the signal shown in FIG. 13B is applied. The concave-down curve 1406 extending between $P_1$ and $P_2$, and the concave-down curve 1408 extending between $P_3$, $P_5$ and $P_4$ illustrate the actual displacement with decreasing voltage when the signal shown in FIG. 13B is applied.

With the displacement as a function of applied signal for both increasing and decreasing applied signals known, curves can be constructed extending between each pair of points and approximating the curvature of the displacement plots versus the applied voltage signal. The equations describing the motion of an actuator element when driven by a drive signal without hysteresis compensation are referred to herein as hysteresis models. Although the plots of position versus voltage of the actuator elements in this example are curved, in other embodiments the plots may be linear, or can have other shapes. In this example, these pairs can be $\{P_1,$ $P_2\}$, $\{P_2, P_3\}$, $\{P_3, P_4\}$ and $\{P_4, P_5\}$. In the illustrated example, the curves can be defined by quadratic polynomials such that the curves are parabolas. However, in other embodiments, the curves can be approximated by higher-order polynomial equations of any degree. In certain embodiments, an input condition can be that all of the resulting parabolas have a constant curvature. However, in other embodiments, the curvature of one or more of the parabolas may be different. In certain embodiments, when the voltage signal changes direction (e.g., from ramping up to ramping down), a new parabola can be determined. The new parabola can be defined between a first point or voltage value at which the voltage signal changes direction, and the next voltage value (e.g., a second voltage value) where the voltage signal again changes direction. Thus, in certain embodiments, the curves can be predetermined for a selected voltage drive signal having a predetermined waveform (e.g, calibrated to result in a selected motion of the piezo element).

Figure 17:
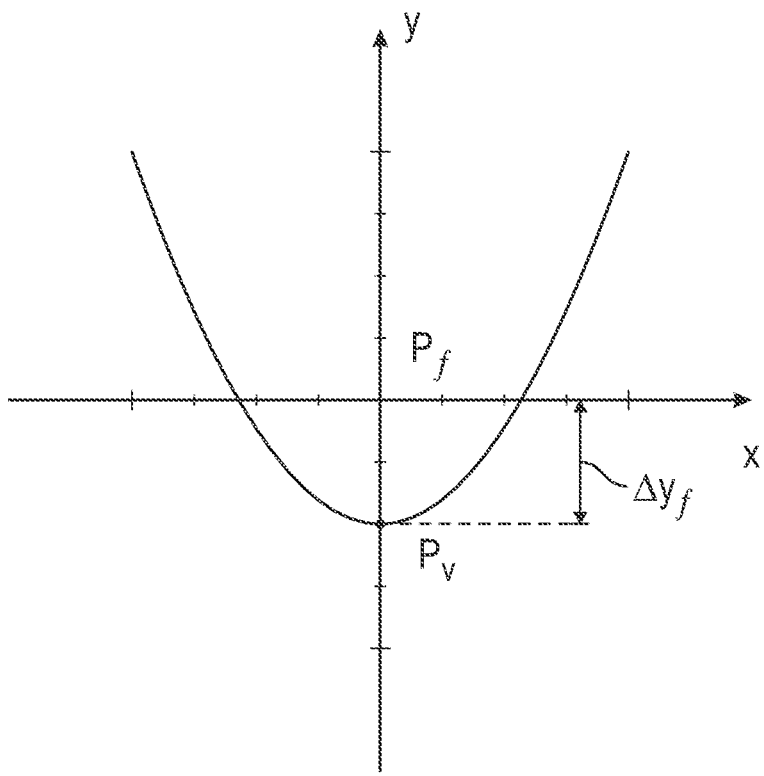
FIG. 17 is a graph illustrating a representative parabola that may be used for hysteresis compensation according to the methods described herein.

The parabolas can be described as polynomials in terms of the vertex point and focal point. FIG. 17 illustrates a representative parabola including a vertex $P_v$ and a focal point $P_f$. Equation 2 is a representative example of a hysteresis model describing parabolas as may be used for hysteresis compensation in terms of the vertex and the focal point:

$$y = \frac{1}{4\Delta y_f}(x - x_v)^2 + y_v \quad \text{Equation 2}$$

In Equation 2, $\Delta y_f$ is the vertical distance between the focal point $P_f$:$(x_f, y_f)$ and the vertex point $P_v$:$(x_v, y_v)$. The terms $x_f$, $y_f$ represent the voltage value at the focal point and the displacement value at the focal point, respectively. The terms $x_v$, $y_v$ represent the voltage and the displacement at the vertex, respectively. By substituting $$\Delta y_o = \frac{1}{4\Delta y_f}$$

as a measure for the curvature, the equation becomes:

$$y = \Delta y_0(x-x_v)^2 + y_v \quad \text{Equation 3}$$

In certain embodiments, the amount of curvature, which is represented by $\Delta y_0$, can also be equal to the amount of hysteresis of the piezo-material, referred to herein as a hysteresis parameter. The hysteresis parameter can be expressed as a factor between 0 and 1, where 0 means that the material displays no hysteresis, and 1 means that the displacement of the material lags behind the voltage by 100% of the expected displacement. However, in certain embodiments, the displacement may lag by greater than 100% of the expected displacement for a given applied voltage, such as 125% or more. For example, with reference to FIG. 14, application of a voltage decreasing form 250 V to 0 V can produce a brief positive displacement above $1 \times 10^{-6}$ m, such as $1.25 \times 10^{-6}$ m, before the displacement also begins to decrease. In one exemplary embodiment, for a four-layer shear piezo element, the hysteresis parameter $\Delta y_0$ can be approximately 40% (0.4), so this means that:

$$\Delta y_0 = 0.4 \quad \text{Equation 4}$$

In certain embodiments, the hysteresis parameter $\Delta y_0$ can be determined based on measurement. In other embodiments, the hysteresis parameter $\Delta y_0$ can be determined based at least in part on variables such as the piezoelectric material(s) of a given piezo actuator, the dimensions and/or shape of the piezo actuator, constraints on motion imposed by the environment, or combinations thereof. Where the piezo actuator comprises multiple piezo elements in a stacked arrangement, the hysteresis parameter $\Delta y_0$ can also be determined based at least in part on the number and/or shape, thickness, etc., of the stacked piezo elements. The hysteresis parameter may be the same or different for different piezo actuators in a drive unit. For example, the hysteresis parameter may be different for shear elements as compared to clamp elements, and/or may be different for different shear elements or different clamp elements. In certain embodiments, the hysteresis parameter(s) may be stored in a lookup table or other data structure, and referenced by the controller when determining hysteresis compensation for a selected actuator element. In some embodiments, the hysteresis parameters of the piezo elements can be periodically measured or reevaluated, such as during maintenance. In certain embodiments, according to the expression given above, the hysteresis parameter $\Delta y_0$ can be inversely proportion to four times the y-coordinate of the focal point $P_f$ although the parameter may differ depending upon the function or polynomial selected.

In order to define the curve $c_{1,2}$: $\{P_1, P_2\}$, where $P_1$: $(x_1, y_1)$ and $P_2$: $(x_2, y_2)$, and where $P_1$ and $P_2$ are points on the curve and are assumed to be known, Equation 3 can be solved with respect to $x_v$ and $y_v$. Expressions for $y_1$ and $y_2$ are given below in Equation 5.

$$y_1 = y_0(x_1 - x_v)^2 + y_v$$

$$y_2 = \Delta y_0(x_2 - x_v)^2 + y_v \qquad \text{Equation 5}$$

$x_v$ can be solved for by subtraction of the two equations in Equation 5, and $y_v$ can be solved for by addition of the two equations:

$$x_v = \frac{(x_1^2 - x_2^2) - \frac{(y_1 - y_2)}{\Delta y_o}}{2(x_1 - x_2)} \qquad \text{Equation 6}$$

$$y_v = \frac{1}{2}\left(y_1 + y_2 - \Delta y_0\left((x_1 - x_v)^2 + (x_2 - x_v)^2\right)\right)$$

One exemplary method to counteract hysteresis in a piezo element is to determine a function or equation which is the inverse of the hysteresis model given in Equation 3. This can be done by solving the equation for x and substituting x for y and y for x:

$$y(x) = y_v \pm \sqrt{\frac{1}{\Delta y_0}(x - x_v)} \qquad \text{Equation 7}$$

and:

$$x_v = \frac{1}{2}\left(x_1 + x_2 - \Delta y_0\left((y_1 - y_v)^2 + (y_2 - y_v)^2\right)\right) \qquad \text{Equation 8}$$

$$y_v = \frac{(y_1^2 - y_2^2) - \frac{(x_1 - x_2)}{\Delta y_o}}{2(y_1 - y_2)}$$

In certain embodiments, the voltage applied to a piezo-element in a drive unit will change over time. In certain embodiments, when the scaled voltage (x) changes direction, which can be equivalent to the derivative $$\frac{dx}{dt}$$

of the voltage signal with respect to time changing sign, y(x) can be recalculated. In certain embodiments, it is assumed that the algorithm can be updated for each step k, and that the time between each step k equals $T_s$. In such embodiments, the procedure can be as given below in Table 2.

TABLE 2

Procedure for Determining Hysteresis Compensation Curves if $\left(\frac{dx}{dL}(t_{k-1}) \neq \frac{dx}{dL}(t_k)\right)$ do:

Step 1  $\quad d = \text{sign}\left(\frac{dx}{dt}\right)$

Step 2  if $(|x| > x_1)$ do:
$x_2 = d \cdot 1$
$y_2 = d \cdot 1$
else do:
$x_2 = x_1$
$y_2 = y_1$ Step 3  if $(d = 1$ and $x > x_2)$ do:
$x_1 = x(t_{k-1})$
$y_1 = y(t_{k-1})$
$x_2 = 1$
$y_2 = 1$
if $(d = -1$ and $x < x_2)$ do:
$x_1 = x(t_{k-1})$
$y_1 = y(t_{k-1})$
$x_2 = -1$
$y_2 = -1$ Step 4  $\quad x_v = \frac{1}{2}\left(x_1 + x_2 - d\Delta y_0\left((y_1 - y_v)^2 + (y_2 - y_v)^2\right)\right)$ $y_v = \frac{(y_1^2 - y_2^2) - \frac{(x_1 - x_2)}{d\Delta y_0}}{2(y_1 - y_2)}$ $y(t_k) = y_v + d\sqrt{\frac{1}{\Delta y_0}(x(t_k) - x_v)}$ Referring to Table 2 above, if the time derivative of the voltage x at time $t_{k-1}$ does not equal the time derivative at time $t_k$ (e.g., in particular cases, because the direction of the voltage signal has changed), then a variable d is assigned the sign of $$\left(\frac{dx}{dt}\right)$$

in a first step. In a second step, if the absolute value of the voltage is greater than the voltage $x_1$ at point $P_1$, then $x_2$ and $y_2$ at point $P_2$ can be assigned a value of d·1. Otherwise, $x_2 = x_1$ and $y_2 = y_1$. In certain embodiments, the points $P_1$ and $P_2$ can be determined in advance based on the voltage waveform selected, and may be scaled between −1 and 1. In a third step, if d=1 and x is greater than $x_2$, then the variables $x_1$, $y_1$, $x_2$, and $y_2$ can be assigned the corresponding values in Step 3 of Table 2. If d=−1 and x is less than $x_2$, then the variables $x_1$, $y_1$, $x_2$, and $y_2$ can be assigned the corresponding values in Step 3 of Table 2. In a fourth step, the coordinates of a vertex of a hysteresis model curve (e.g., a parabola) approximating the displacement of the piezo element for the given drive voltage signal can be calculated using the equations given in Step 4 of Table 2 for $x_v$ and $y_v$. Since a quadratic function approximating or indicative of the displacement path of the actuator element between points $P_1$ and $P_2$ is known from Equation 3, the inverse of the path can then be calculated using the equation for $y(t_k)$ (e.g., Equation 7) given in Step 4 of Table 2 (referred to herein as an inverse function or equation). As used herein, the function indicative of the displacement path of the actuator element and the inverse function are relations or expressions involving one or more variables, such as voltage, position, the hysteresis parameter $\Delta y_0$, etc. The output of Equation 7 can be used as a hysteresis compensation signal. The voltage signal can then be modified according to the curve given by Equation 7 to provide a hysteresis-compensated signal, where the output of Equation 7 is a hysteresis-compensated portion of the overall drive signal. In embodiments in which the parabola (or other curve) is fit to the curve of displacement vs voltage where the slope is compensated for (e.g., where $P_1$ is (1, 0) and $P_2$ is (-1, 0), the voltage waveform given by Equation 7 can be superimposed on the initial voltage waveform. The hysteresis-compensated signal can then be applied to the piezo element to compensate for hysteresis. In other words, the curvature of the displacement path of the actuator element due to hysteresis can be at least partially reversed or compensated for by modifying the drive signal with the inverse of the expected (e.g., uncompensated) path.

Figure 18A:
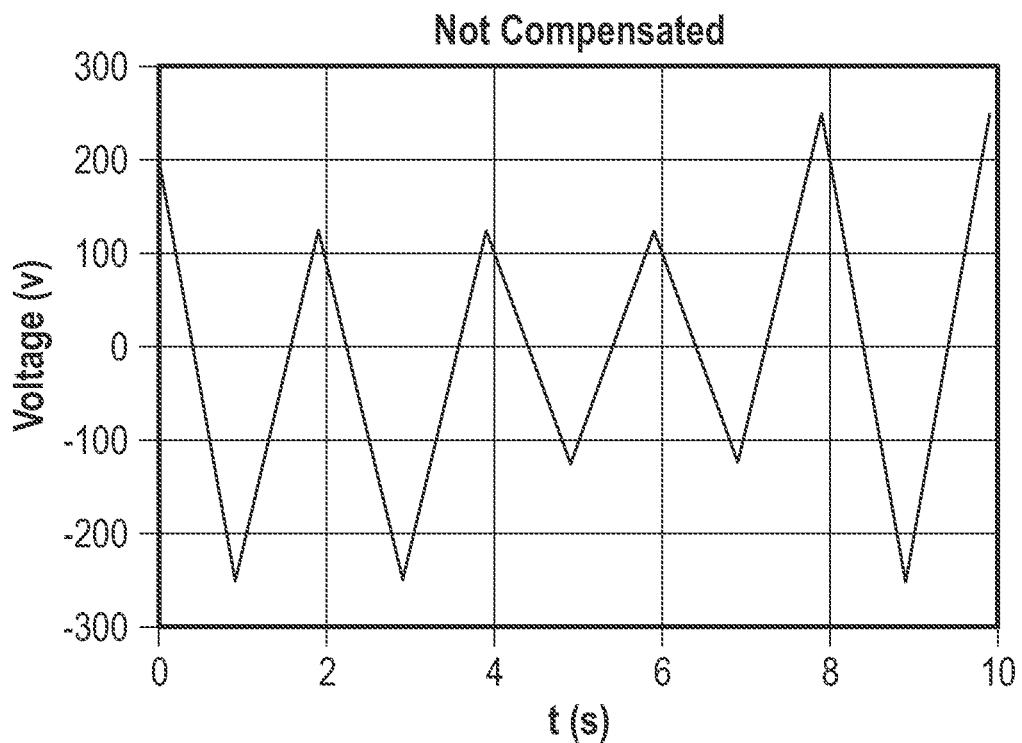
FIG. 18A is a graph illustrating a sawtooth-shaped drive signal.
Figure 18B:
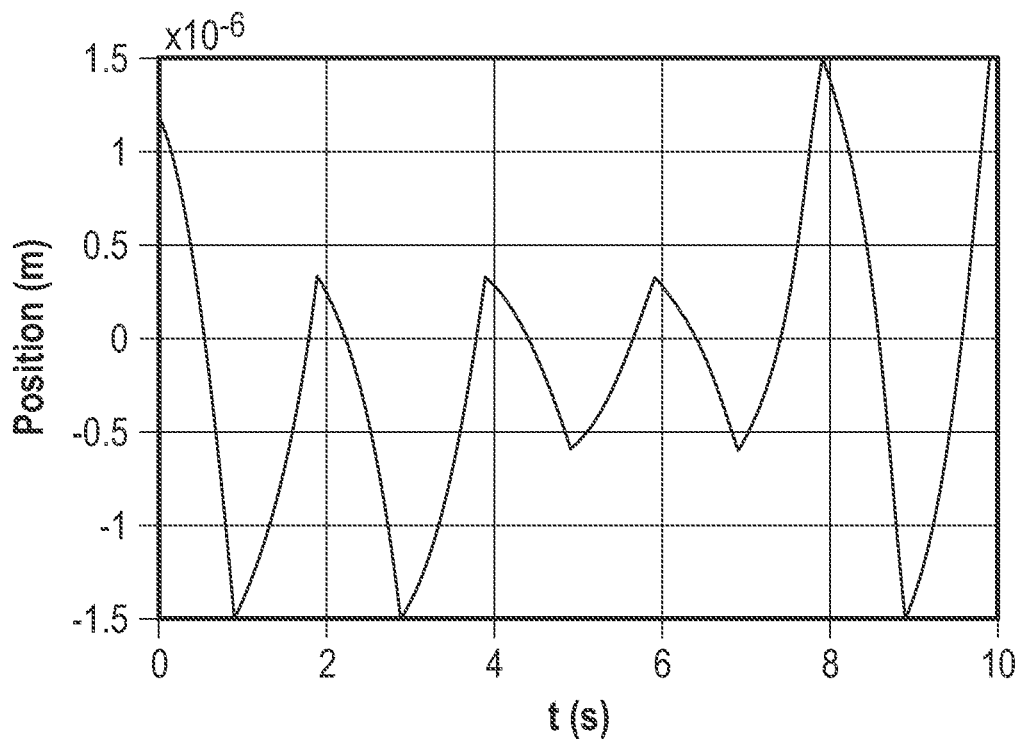
FIG. 18B shows the displacement behavior of a piezo element driven by the drive signal without hysteresis compensation.
Figure 19A:
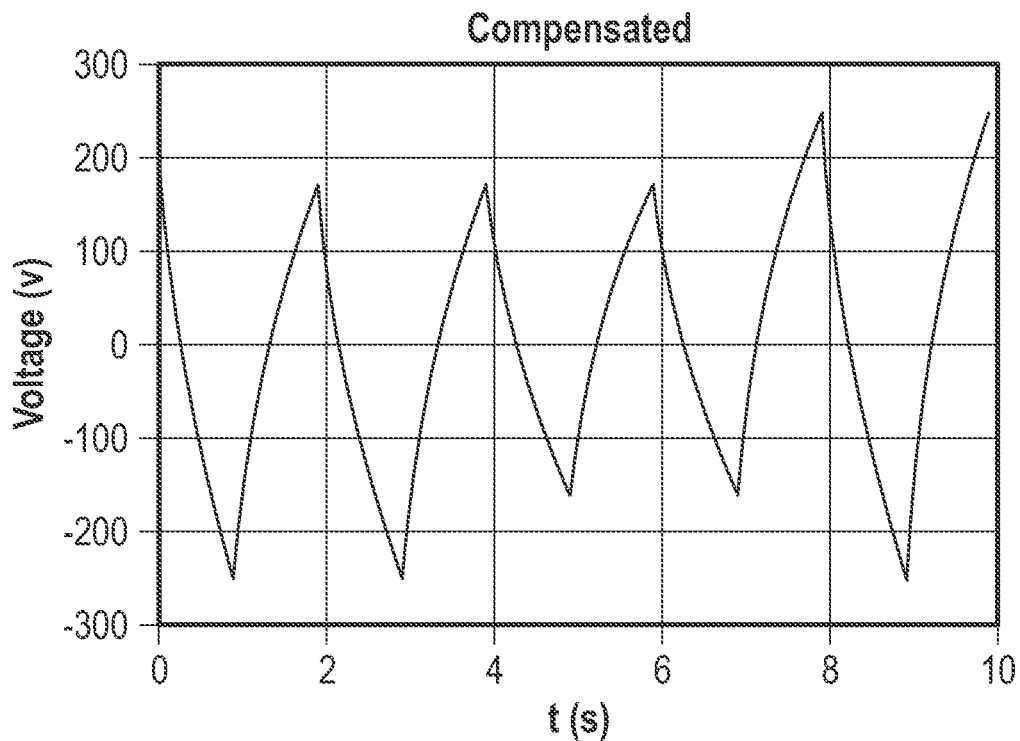
FIG. 19A illustrates the voltage signal of FIG. 18A modified according to the algorithm described herein.
Figure 19B:
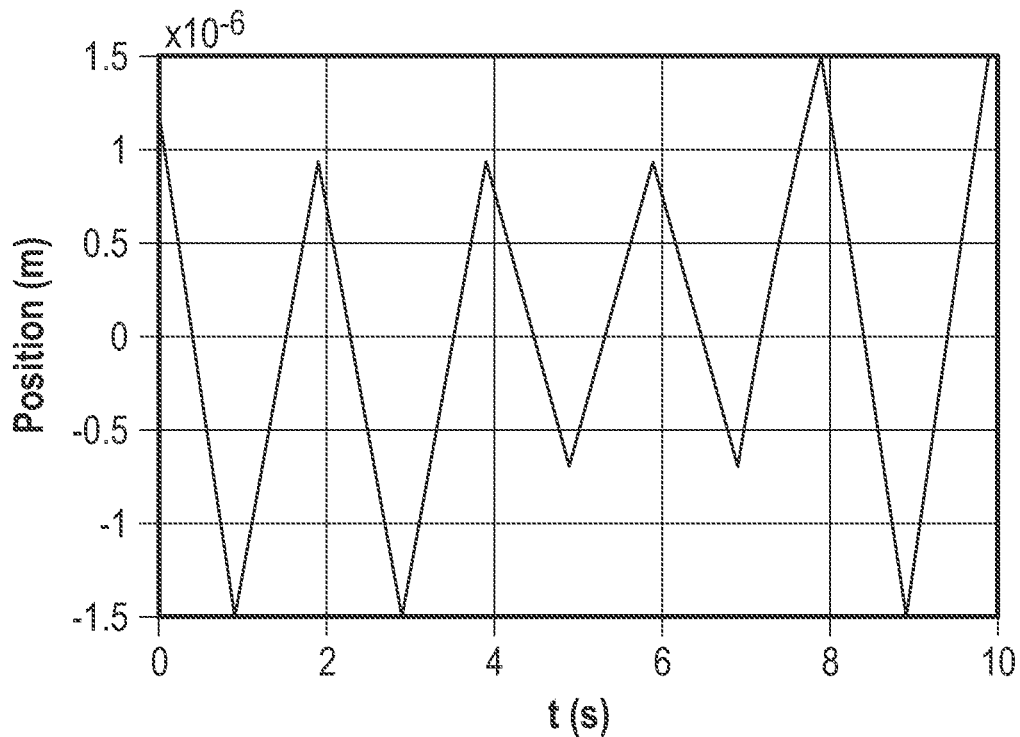
FIG. 19B shows linear extension and contraction of the piezo element between changes in the direction of the voltage signal without hysteresis.

FIGS. 18A-18B and 19A-19B show the result of a time-simulation of the algorithm above. FIG. 18A illustrates a sawtooth-shaped drive signal, and FIG. 18B shows the displacement behavior of a piezo element driven by the drive signal without hysteresis compensation. The piezo element demonstrates the curved displacement behavior characteristic of hysteresis as the voltage signal changes with time. FIGS. 19A-19B illustrate the result when the voltage signal is modified according to the algorithm described above. FIG. 19A shows the voltage signal modified to exhibit curved or parabolic upward and downward ramping, and FIG. 19B shows the linear extension and contraction of the piezo element between changes in the direction of the voltage signal. As can be seen from FIG. 19A, the modified voltage signal is the inverse of the displacement plot of FIG. 18B. When the actuator element is driven with this modified voltage signal, the hysteresis is almost entirely eliminated, and the positional plot of the actuator element traces a series of nearly unperturbed sawtooth waves.

Figure 20A:
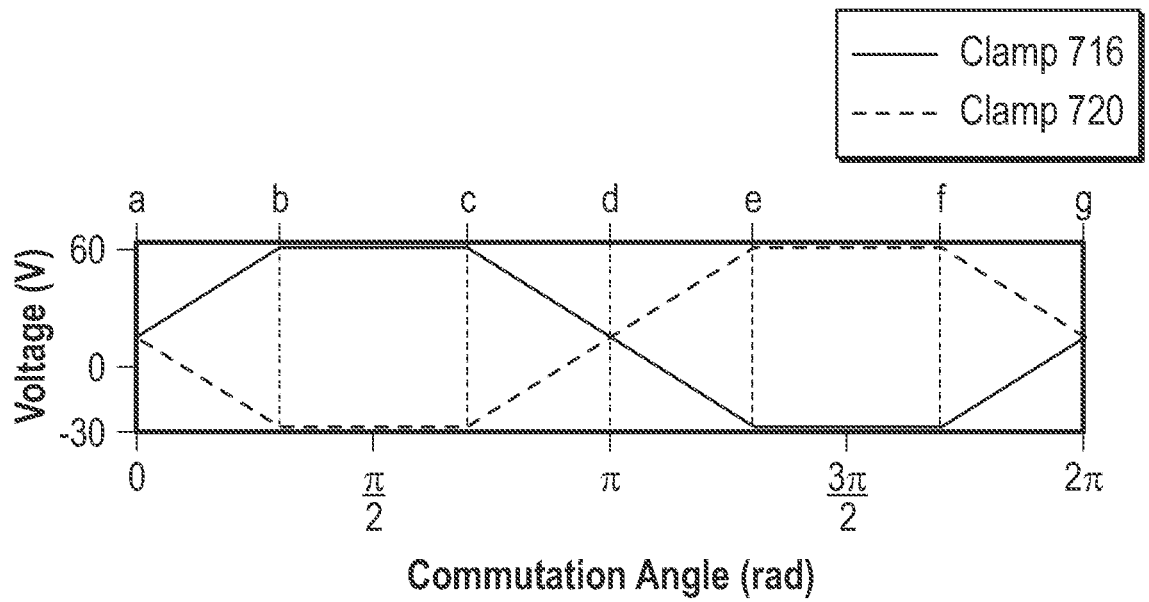
FIG. 20A is a graph of a representative embodiment of a voltage signal inputted to the clamping elements of the drive unit of FIG. 7A-7D.
Figure 20B:
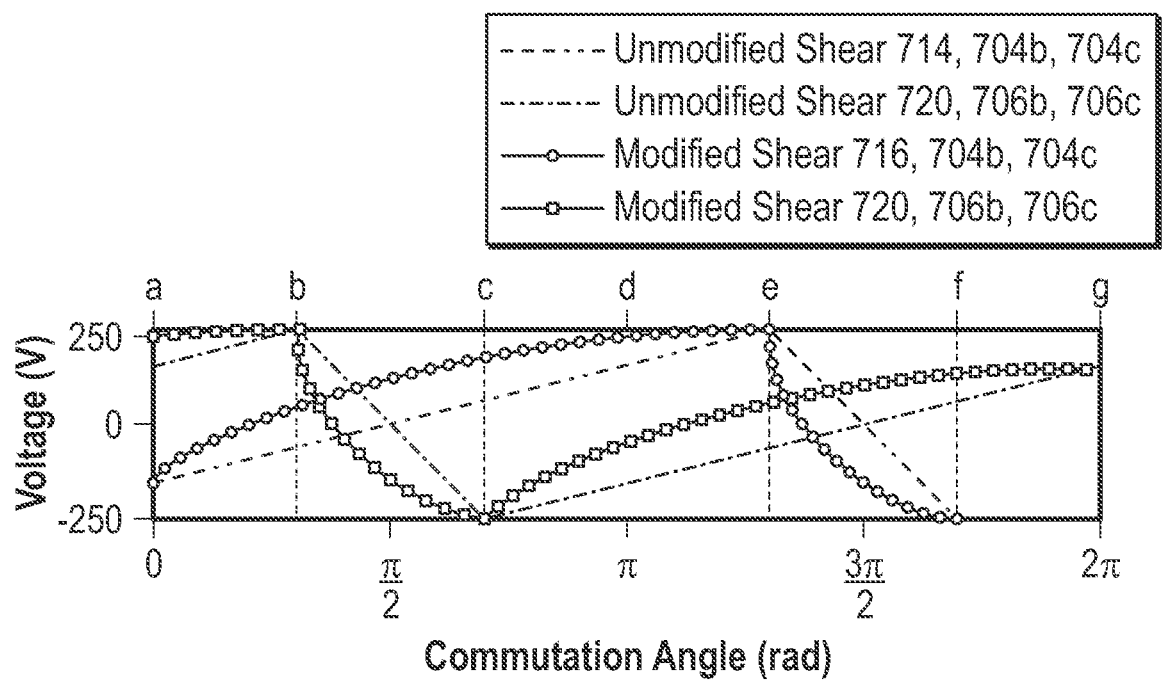
FIG. 20B is a graph of an unmodified shear element voltage signal according to one embodiment superimposed on a shear element voltage signal modified according to the methods described herein.
Figure 21:
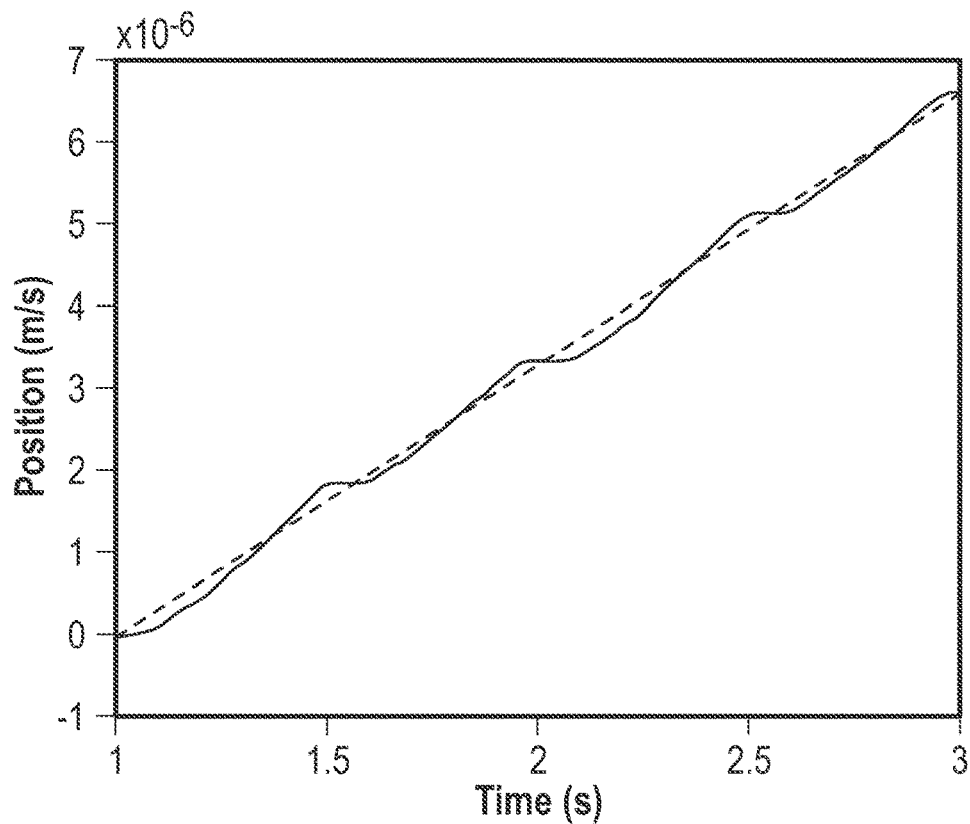
FIG. 21 is a graph of the position of a mover element over time when the shear elements of the driver unit are driven with a modified voltage signal and with an unmodified voltage signal.

FIG. 20A illustrates the drive signal for the clamping elements 716 and 720 of the drive unit of FIGS. 7A-7D. FIG. 20B illustrates the modified drive signal for the shear elements 714, 704b, 704c of the first group 704, and for the shear elements 718, 706b, 706c of the second group 706, in dashed lines superimposed on the unmodified shear element drive signals. FIG. 21 illustrates the measured position of the mover element (shown with a solid line) and the position of the mover element when the shear element(s) of the driver unit are driven with a modified voltage signal (shown with a dashed line) as described herein. As can be seen in FIG. 21, the perturbations in position can be largely eliminated by compensating for hysteresis in the shear elements.

Figure 22:
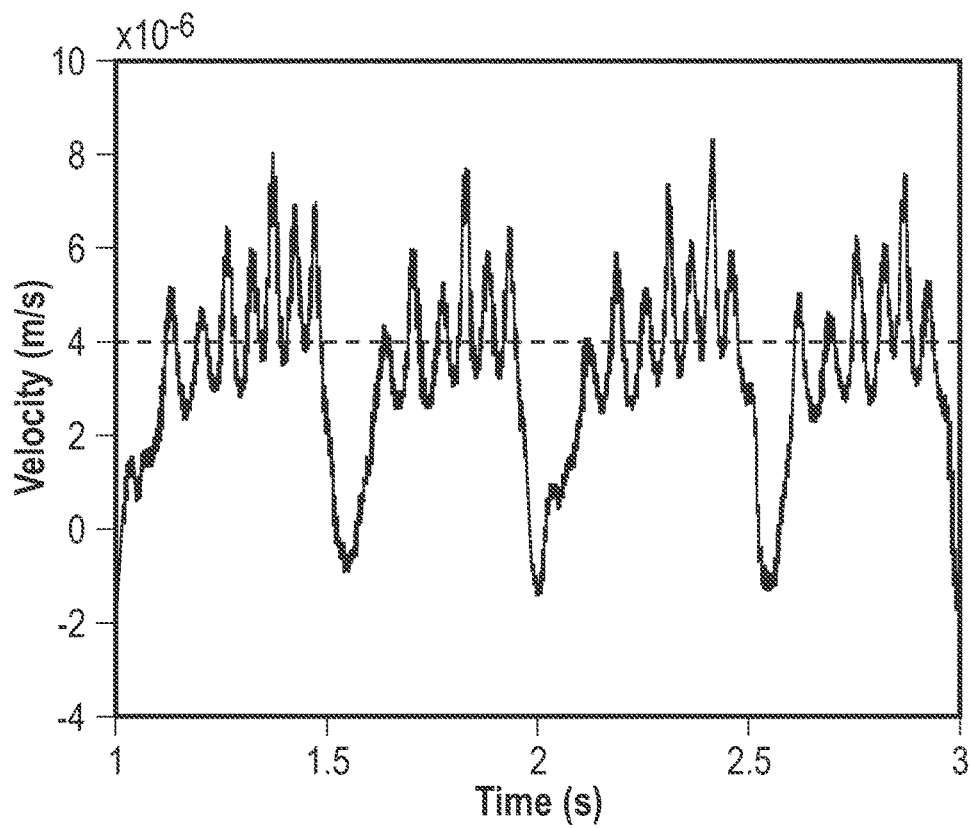
FIG. 22 is a graph of the velocity of a mover element over time when the shear elements of the driver unit are driven with a modified voltage signal and with an unmodified voltage signal.

FIG. 22 illustrates the measured velocity of the mover element (shown with a solid line) and the velocity of the mover element with the shear element(s) of the driver unit driven with a modified voltage signal, as described herein.

As shown in FIG. 22, the perturbations in the velocity of the mover element can be substantially eliminated.

In certain embodiments, the methods described herein can be implemented by a controller or processor, such as a proportional-integral-derivative (PID) controller in a control system similar to FIG. 9. In certain embodiments, one or more measured parameters (e.g., position, velocity, etc.) can be fed back to the controller, which can modify the voltage signals based at least in part on the measured parameters.

While the above examples are described with reference to functions associated with hysteresis, in some implementations, suitable approximations are based on stored values that characterize hysteresis in a particular actuator. These values can be stored in a memory or in a look up table, or can be generated based on the functional relationships above as may be convenient.

Example 9: Example Computing Environment

Figure 23:
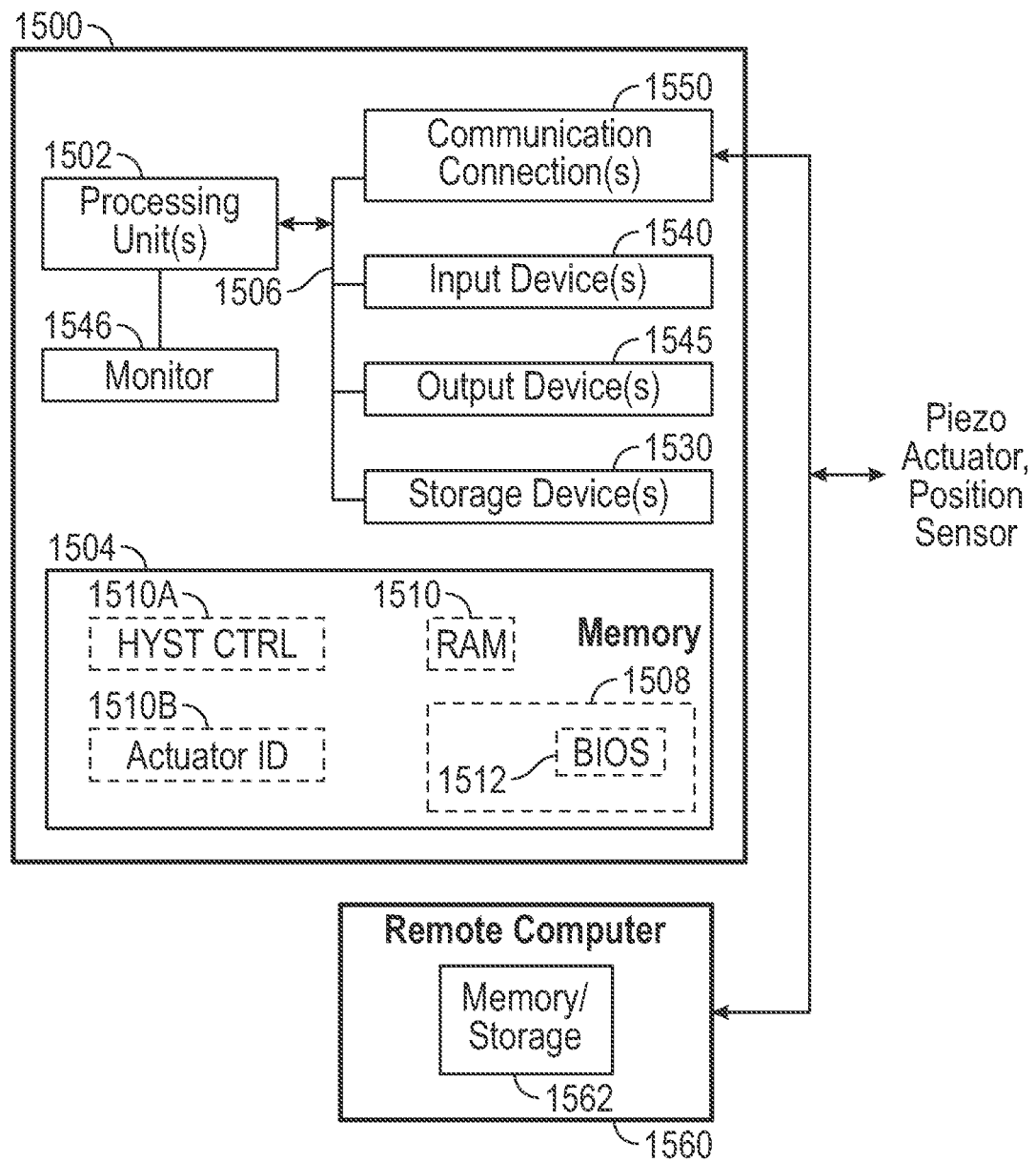
FIG. 23 illustrates a representative computer control system for use in implementing the disclosed methods and apparatus.

FIG. 23 and the following discussion are intended to provide a brief, general description of an exemplary computing environment in which the disclosed technology may be implemented. For example, the methods and processes described herein can be carried out by a controller or processor configured similarly to the computing environment described below. Moreover, the disclosed technology may be implemented with other computer system configurations, including hand held devices, digital signal processors (DSPs), multiprocessor systems, microprocessor-based or programmable consumer electronics, network PCs, mini-computers, mainframe computers, and the like. The disclosed technology may also be practiced in distributed computing environments where tasks are performed by remote processing devices that are linked through a communications network.

With reference to FIG. 23, an exemplary system for implementing the disclosed technology includes a general-purpose controller in the form of an exemplary conventional PC 1500, including one or more processing units 1502, a system memory 1504, and a system bus 1506 that couples various system components including the system memory 1504 to the one or more processing units 1502. The system bus 1506 may be any of several types of bus structures including a memory bus or memory controller, a peripheral bus, and a local bus using any of a variety of bus architectures. The exemplary system memory 1504 includes read only memory (ROM) 1508 and random-access memory (RAM) 1510. A basic input/output system (BIOS) 1512, containing the basic routines that help with the transfer of information between elements within the PC 1500, is stored in ROM 1508. In the example of FIG. 20, data and processor-executable instructions for controlling motion of the positioning system, hysteresis control, imaging, processing, and operational modes of an STEM and/or a FIB are stored in a memory 1510A, and data and processor-executable instructions for identifying and providing drive signals to actuator elements, and/or identifying and quantifying beam components are stored in memory 1510B.

The exemplary PC 1500 further includes one or more storage devices 1530 such as a hard disk drive for reading from and writing to a hard disk, a magnetic disk drive for reading from or writing to a removable magnetic disk, and an optical disk drive. Such storage devices can be connected to the system bus 1506 by a hard disk drive interface, a magnetic disk drive interface, and an optical drive interface, respectively. The drives and their associated computer readable media provide nonvolatile storage of computer-readable instructions, data structures, program modules, and other data for the PC 1500. Other types of computer-readable media which can store data that is accessible by a PC, such as magnetic cassettes, flash memory cards, digital video disks.

A number of program modules may be stored in the storage devices 1530 including an operating system, one or more application programs, other program modules, and program data. A user may enter commands and information into the PC 1500 through one or more input devices 1540 such as a keyboard and a pointing device such as a mouse. A monitor 1546 or other type of display device is also connected to the system bus 1506 via an interface, such as a video adapter. Outputs such as commands, drive signals, etc., can be transmitted via one or more output devices 1545.

The PC 1500 may operate in a networked environment using logical connections to one or more remote computers, such as a remote computer 1560 including a memory 1562. In some examples, one or more network or communication connections 1550 are included. The remote computer 1560 may be another PC, a server, a router, a network PC, or a peer device or other common network node, and typically includes many or all of the elements described above relative to the PC 1500, although only a memory storage device 1562 has been illustrated in FIG. 23. The personal computer 1500 and/or the remote computer 1560 can be connected to a logical a local area network (LAN) and a wide area network (WAN). In certain embodiments, the remote computer 1560 can comprise a virtual processor implemented in a remote server environment or cloud computing environment.

Example 10: Control System for Hysteresis Compensation

Figure 24:
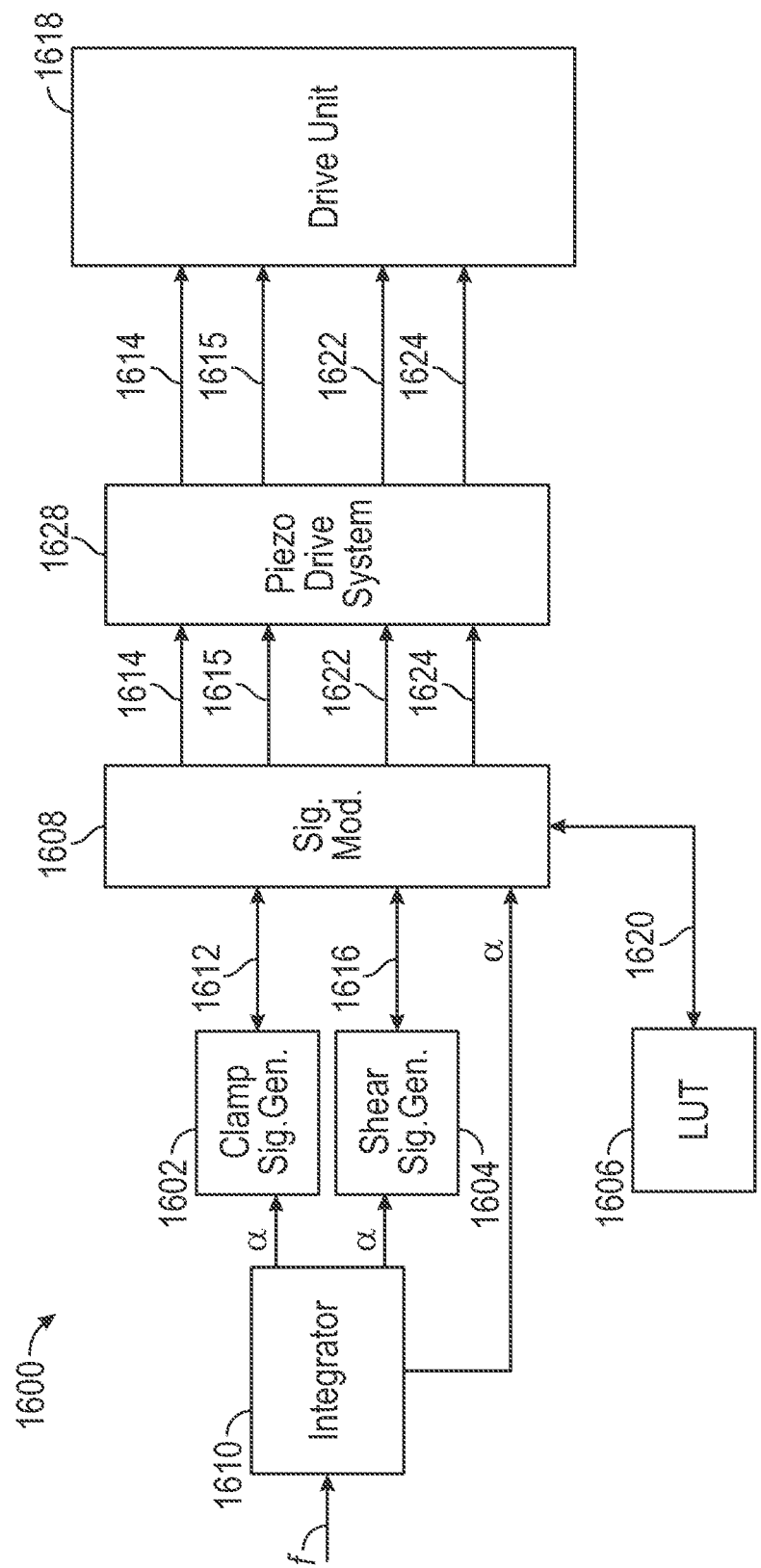
FIG. 24 is a schematic block diagram of a representative control system for implementing the hysteresis compensation systems and methods described herein.

FIG. 24 shows a representative embodiment of a control system 1600 for implementing the previously-described processes. The control system 1600 can be configured to compensate for hysteresis in shear elements, clamp elements, or any other actuator element, in linear or rotational actuators. The control system 1600 can comprise an integrator tool 1610, a clamp signal generator 1602, a shear signal generator 1604, a lookup table (LUT) 1606, and a signal modification tool or module 1608.

A drive frequency fa or a clock signal from a clock signal generator (not shown) at the drive frequency can be provided to the integrator tool 1610 to establish a commutation angle α. In some cases, a digital or other representation of the drive frequency, or a periodic signal at the drive frequency can be provided and used to determine a commutation angle α, as described above. The integrator tool 1610 can output a commutation angle α to the clamp signal generator 1602 and to the shear signal generator 1604. The clamp signal generator 1602 can be configured to produce a plurality of clamp element drive signals represented schematically at 1612 to be applied to one or more clamp elements of a drive unit represented at 1618. For example, the clamp signal generator 1602 can produce a first clamp element drive signal for a first clamp element (e.g., element 716 of FIGS. 7A-7D) and a second clamp element drive signal for a second clamp element (e.g., clamp element 720 of FIGS. 7A-7D). In certain embodiments, the clamp element drive signals can be produced based on data of the commutation angle α, the drive frequency fa, a selected path of the mover element, a selected path of the clamp element (e.g., in order to produce movement of the mover along a selected path), etc.

The shear signal generator 1604 can be configured to produce a plurality of shear element drive signals represented schematically at 1616, such as a first shear element drive signal (e.g., for the shear elements 714, 704b and 704c) and a second shear element drive signal (e.g., for the shear elements 718, 706b and 706c). The shear element drive signals can correspond to the clamp element drive signals so as to produce the selected motion of the mover element, and can be based on the commutation angle α, the drive frequency $f_\alpha$, a selected path of the mover element, a selected path of the shear element, etc.

In some embodiments, the LUT 1606 can comprise an array of paths of the clamp elements and/or the shear elements (e.g., configured to effect a selected motion of the mover element). The LUT 1606 can also store the commutation angle α as a function of time. In some embodiments, the lookup table 1606 can store signals, equations, or functions indicative of positions or paths of the shear and/or clamp elements when drive signals are applied without hysteresis compensation. In some embodiments, the LUT 1606 can comprise an array of hysteresis compensation signals for various commutation angles, drive frequencies, and/or actuator element paths. In some embodiments, the hysteresis compensation signals can be based on an inverses or reciprocals of hysteresis models describing positions or paths of the shear elements and/or clamp elements when the elements driven by a selected drive signal, as described above. The hysteresis compensation signals in the LUT 1606 can be precalculated and stored in static program storage, calculated as part of the control system's initialization phase, or stored in hardware in application-specific platforms. The LUT 1606 can also store hysteresis models of the various actuator elements.

In some embodiments, a path of an object (e.g., the mover element, a workpiece coupled to the mover element, etc.) to be moved by the drive unit can be selected and provided to the control system 1600. In some embodiments, the path can be selected by the signal modification tool 1608, or by another control system, based on system requirements. In particular embodiments, the signal modification tool 1608 can select hysteresis compensation signals 1620 from the LUT based on the selected path of the mover element, and/or on system requirements (e.g., based on commutation angle, detection of a sign change of the direction of the actuator element drive signal, etc.). In embodiments in which the hysteresis compensation signals 1620 are based on the path of the actuator elements without hysteresis compensation, the signal modification tool 1608 can determine or compute the inverse of the signals 1620 to obtain an inverse signal for the actuator elements. The signal modification tool 1608 combine the hysteresis compensation signals with the appropriate drive signal to obtain modified or hysteresis-compensated shear element drive signals 1622 and 1624, and/or hysteresis-compensated clamp element drive signals 1614 and 1615. The hysteresis-compensated drive signals 1614, 1615, 1622 and 1624 can be transmitted to the piezo drive system tool 1628, which can scale and/or condition the signals, and can convert the signals from digital signals to analog signals using a digital-to-analog converter (DAC). The hysteresis-compensated drive signals can be applied to the drive unit 1618 to move the actuators of the drive unit to produce movement of the mover element relative to the drive unit along the selected path.

In certain embodiments, the clamp element drive signals and the shear element drive signals can be determined based on the frequency $f_\alpha$ applied to the control system 1600, or independently of the frequency $f_\alpha$. Additionally, although the system 1600 depicted in FIG. 24 is a feed-forward control system, in other embodiments one or more variables such as mover position, mover velocity, actuator position and/or velocity, voltage, etc., can be measured and fed back to the signal modification tool 1608, which can use such data to select hysteresis compensation signals.

Example 11: Control System for Hysteresis Compensation

Figure 25:
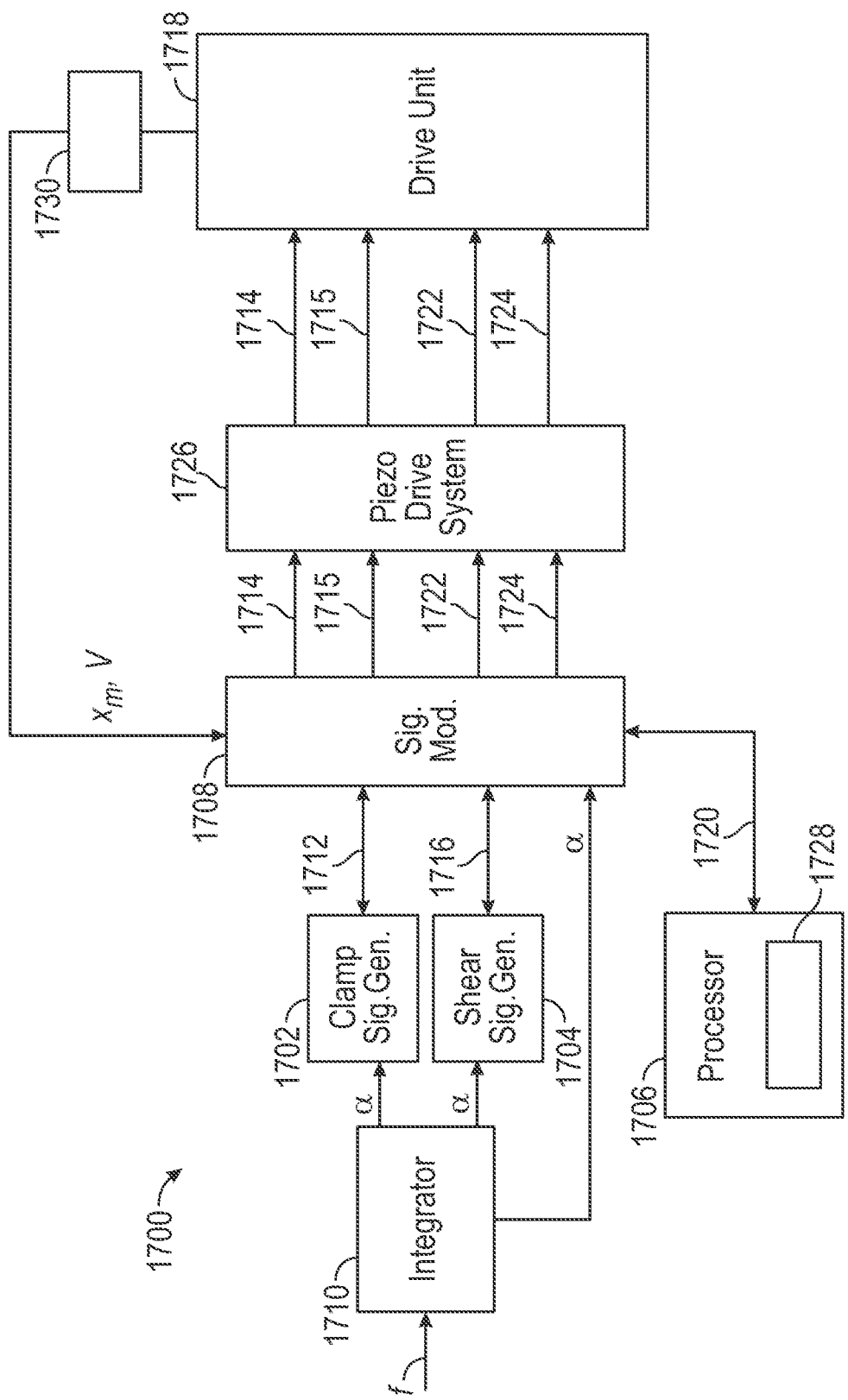
FIG. 25 is a schematic block diagram of another embodiment of a control system for implementing the hysteresis compensation systems and methods described herein.

FIG. 25 shows another representative embodiment of a control system 1700 for implementing the previously-described processes. The control system 1700 can be configured to compensate for hysteresis in shear elements, clamp elements, or any other type of actuator element in linear or rotational actuators. The control system 1700 can comprise an integrator tool 1710, a clamp signal generator 1702, a shear signal generator 1704, a processor 1706 comprising a memory unit 1728, and a signal modification tool 1708.

A drive frequency $f_\alpha$ or a clock signal from a clock signal generator (not shown) at the drive frequency can be provided to the integrator tool 1710 to establish a commutation angle α. In some cases, a digital or other representation of the drive frequency, or a periodic signal at the drive frequency can be provided and used to determine a commutation angle α, as described above. The integrator tool 1710 can output a commutation angle α to the clamp signal generator 1702 and to the shear signal generator 1704. The clamp signal generator 1702 can be configured to produce a plurality of clamp element drive signals represented schematically at 1712 to be applied to one or more clamp elements of a drive unit represented at 1710. For example, the clamp signal generator 1702 can produce a first clamp element drive signal for a first clamp element (e.g., element 716 of FIGS. 7A-7D) and a second clamp element drive signal for a second clamp element (e.g., clamp element 720 of FIGS. 7A-7D).

The shear signal generator 1704 can be configured to produce a plurality of shear element drive signals represented schematically at 1716, such as a first shear element drive signal (e.g., for the shear elements 714, 704b and 704c) and a second shear element drive signal (e.g., for the shear elements 718, 706b and 706c).

In some embodiments, the memory unit 1728 can comprise data of a plurality of paths of the clamp elements and/or the shear elements between selected positions. In some embodiments, the memory unit 1728 can store hysteresis models of the clamp and/or shear elements. In some embodiments, the hysteresis models can comprise data of signals, equations, or functions indicative of positions or displacement paths of the shear and/or clamp elements when drive signals are applied without hysteresis compensation. In some embodiments, the memory unit 1728 can comprise a plurality of precalculated hysteresis compensation signals 1720 for various commutation angles, drive frequencies, and/or actuator element paths. In other embodiments, the memory unit 1728 can comprise data of positions and/or voltage values where the drive signals of the shear and clamp elements change direction. The data in the memory 1728 can be precalculated and stored in the memory 1728, calculated by the processor unit 1706 as part of the control system's initialization phase, and/or calculated based on information of the shear and/or clamp element drive signals 1712, 1716.

In some embodiments, the processor 1706 can calculate or determine hysteresis compensation signals 1720 based on the drive frequency $f$, the commutation angle α, selected actuator element paths, and/or a plurality of predetermined shear and/or clamp drive signals stored in the memory 1728. In some embodiments, a path of an object (e.g., the mover element, a workpiece coupled to the mover element, etc.) to be moved by the drive unit can be selected and provided to the control system 1700. In some embodiments, the path can be selected by the processor 1706 or another control system. In certain embodiments, the processor 1706 can determine hysteresis compensation signals 1720 by identifying changes in the direction of the actuator elements. Such changes in direction can be identified based signs of the rates of change of the drive signals provided by the signal generators 1702 and 1704. In some embodiments, the hysteresis compensation signals 1720 can be based on actuator element hysteresis models stored in the memory 1728. In certain embodiments, the hysteresis models can be based on the inverse or reciprocal of the positions or paths of the shear or clamp elements when drive signals are applied to the elements without hysteresis compensation, as described above. In some embodiments, the processor 1706 can select precalculated hysteresis compensation signals from the memory 1728.

The hysteresis compensation signals 1720 can be provided to the signal modification tool 1708, which can combine the signals 1720 with the appropriate shear and/or clamp element drive signal(s) to produce hysteresis-compensated shear element drive signals 1722 and 1724, and/or hysteresis-compensated clamp element drive signals 1714 and 1715. The modified shear element drive signals 1722 and 1724, along with the clamp element drive signals 1714 and 1715, can be scaled and/or conditioned by the piezo drive system 1726, converted to analog signals by a digital-to-analog converter (DAC) (e.g., part of the piezo drive system 1726), and outputted to the drive unit 1718 to produce movement of a mover element (e.g., mover element 702) relative to the drive unit.

In certain embodiments, a position encoder 1730 can determine data of a displacement $x_m$ of the mover element and/or of a velocity v of the mover element, and can transmit the data back to the signal modification tool 1708 and/or to the processor 1706. The processor 1706 can use the position and/or the velocity data to determine or update the hysteresis compensation signals, to update the hysteresis models of the actuator elements, etc.

Example 12: Hysteresis Measurement and Compensation Using Reference Capacitance

Figure 26:
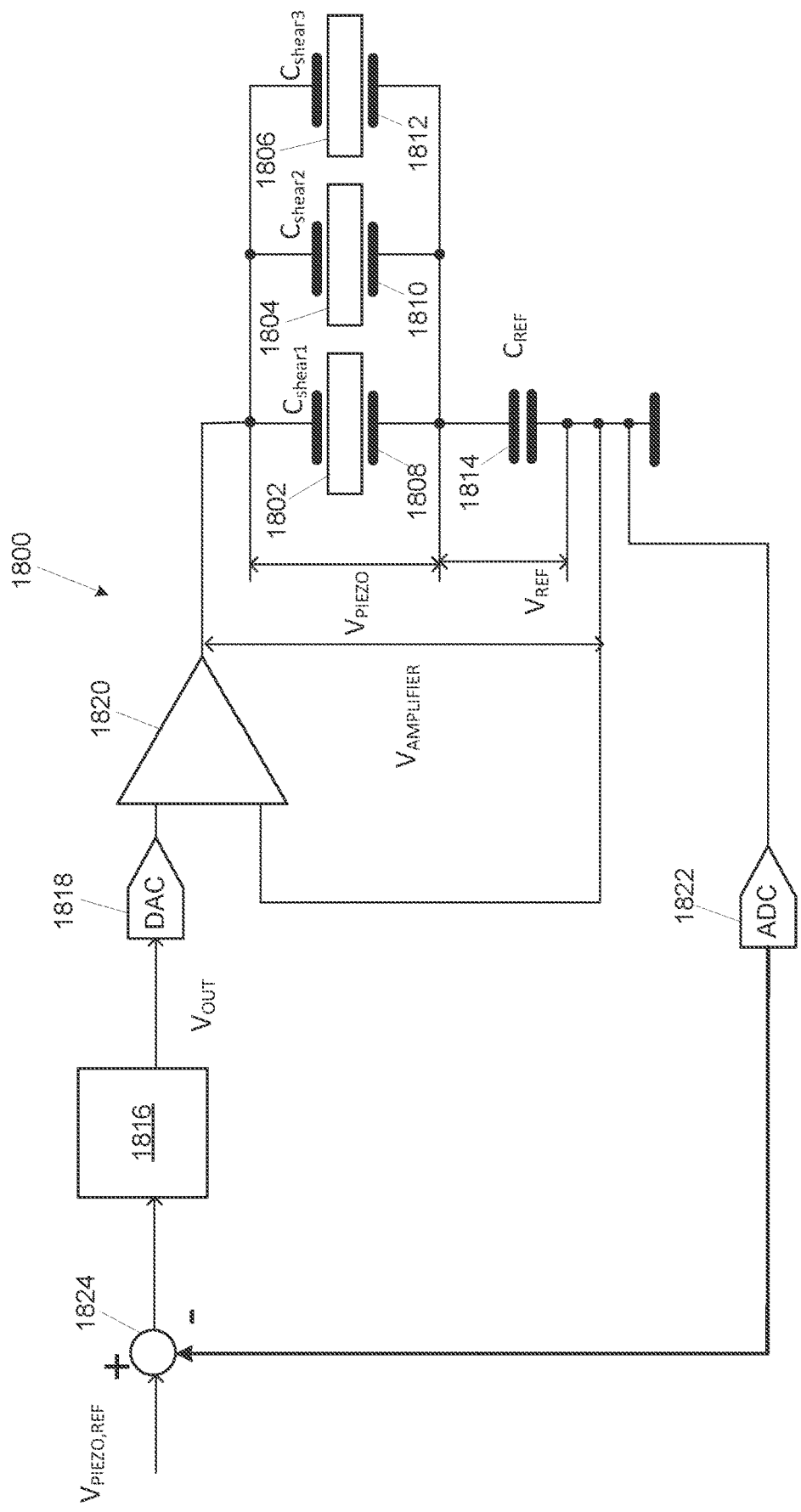
FIG. 26 is a schematic block diagram of another embodiment of a control system for implementing hysteresis compensation using reference capacitors.

FIG. 26 shows another control system 1800 including a plurality of capacitors, and configured to determine and/or correct for hysteresis of a piezo element or a set of piezo elements. For illustrative purposes, the following example proceeds with reference to three shear piezo elements 1802, 1804, and 1806, although the system may be configured for use with clamping elements as well. A capacitor 1808 can be associated with the shear element 1802, a capacitor 1810 can be associated with the shear element 1804, and a capacitor 1812 can be associated with the shear element 1806. The capacitors 1808-1812 can be wired in parallel, and the system can comprise a reference capacitor 1814 wired in series with the three capacitors 1808-1812. A piezo element reference voltage $V_{PIEZO,REF}$ can be supplied to a control module or tool 1816, described further below. The voltage output by the module 1816 can be converted to an analog signal by a digital to analog converter (DAC) 1818, and supplied to an operational amplifier 1820 at the non-inverting input. A voltage $V_{AMPLIFIER}$ output by the amplifier 1820 can be supplied to the capacitors 1808-1812 associated with the shear elements. A voltage drop $V_{REF}$ can be measured across the reference capacitor 1814, converted to a digital signal by an analog-to-digital (ADC) converter 1822, and subtracted from the reference signal $V_{PIEZO,REF}$ at a summing junction 1824.

The modified or summed voltage signal from the summing junction 1824 can be inputted to the control module 1816 (e.g., as negative feedback). The control module 1816 can determine the difference between the voltage drop $V_{REF}$ across the reference capacitor 1814 and the piezo element reference voltage $V_{PIEZO,REF}$, and can apply control to reduce the difference. In certain embodiments, the reference voltage $V_{REF}$ can be correlated with hysteresis of the actuator elements 1802-1806. For example, in certain embodiments, the voltage $V_{REF}$ measured across the reference capacitor 1814 can display cyclical or looping behavior similar to FIG. 14 or 15 because of hysteresis in the actuator elements 1802-1806. The voltage drop $V_{REF}$ can also be supplied to the inverting input of the amplifier 1820.

In certain embodiments, the controller 1816 can apply a gain K to the summed voltage signal, such as indicated in Equation 9 below to produce the voltage output $V_{OUT}$ to the DAC 1818.

$$V_{OUT} = K \times (V_{PIEZO,REF} - V_{REF})$$  Equation 9

In other embodiments, the controller 1816 can apply any of proportional, integral, and/or derivative control, or combinations thereof. The control methodology can be selected to reduce hysteresis of the piezo elements 1802-1806 (e.g., by reducing the difference between $V_{REF}$ and $V_{PIEZO,REF}$.

The control system 1800 can be used in combination with any of the motor and control systems described herein. For example, any of the piezo motors described herein can comprise a reference capacitor similar to 1814 for each of the two groups of shear piezo elements, and a reference capacitor for each of the clamp piezo elements, which can be used to reduce hysteresis of the piezo elements.

Figure 27:
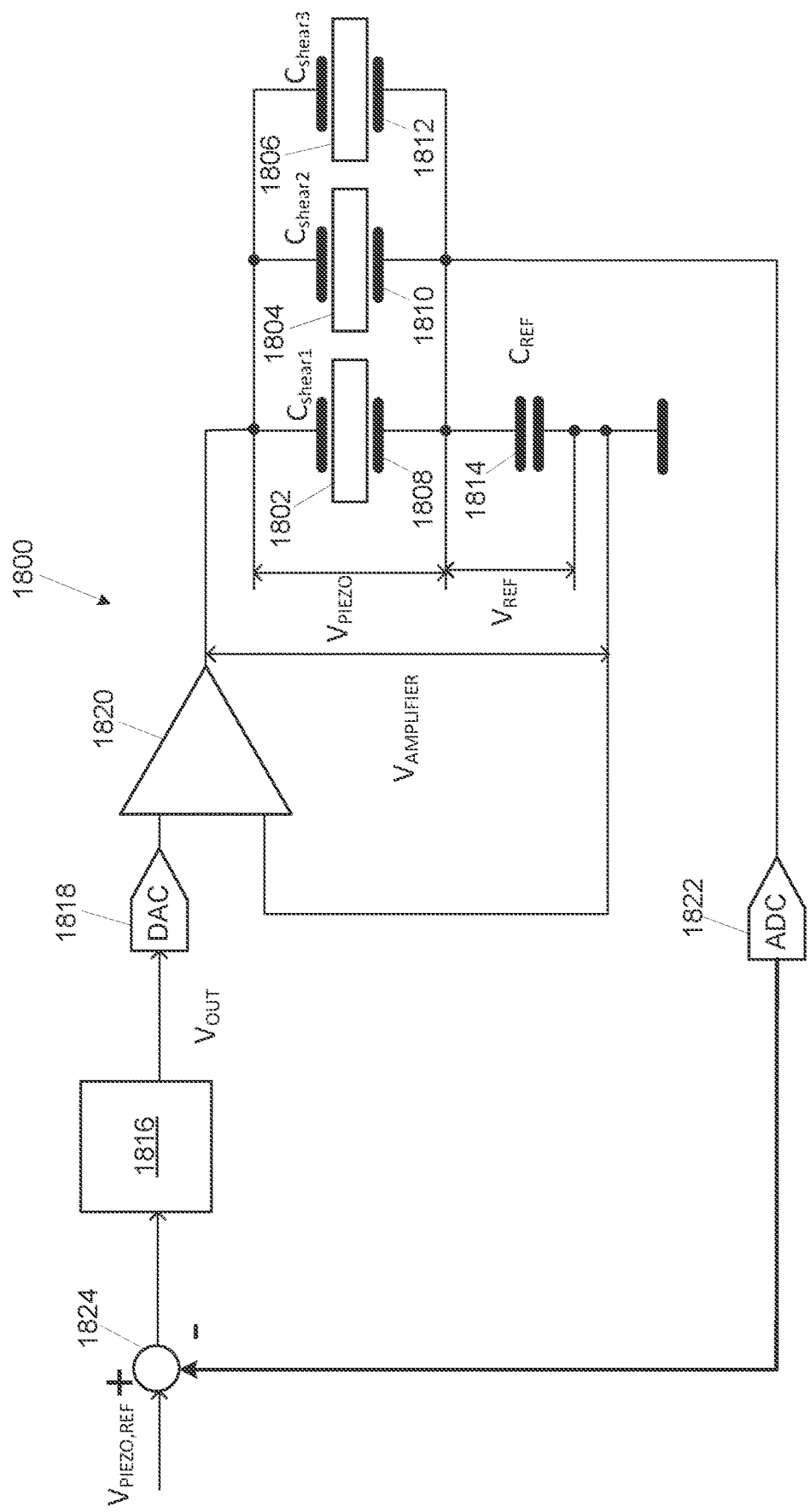
FIG. 27 is a schematic block diagram of another embodiment of a control system for implementing hysteresis compensation using reference capacitors.

In another embodiment shown in FIG. 27, the voltage drop $V_{PIEZO}$ across the shear capacitors 1808-1812 can be provided to the ADC converter 1822.

Additional details of the piezo motors, stages, and beam systems described herein can be found in the application entitled "Systems and Methods of Clamp Compensation," filed herewith (now U.S. application Ser. No. 16/685,897, issued as U.S. Pat. No. 11,562,877), and in the application entitled "Electron Microscope Stage," filed herewith (now U.S. application Ser. No. 16/686,004, issued as U.S. Pat. No. 11,244,805), each of which is incorporated by reference herein in its entirety.

The disclosed embodiments are not limited to actuators comprising piezoelectric elements, but may be extended to any other type of actuator that exhibits hysteresis, such as rotary or linear motors or actuators, voice coil motors, etc.

Having described and illustrated the principles of the disclosure with reference to the illustrated embodiments, it will be recognized that the illustrated embodiments can be modified in arrangement and detail without departing from such principles. For instance, elements of the illustrated embodiment shown in software may be implemented in hardware and vice-versa. Also, the technologies from any example can be combined with the technologies described in any one or more of the other examples.

Explanation of Terms

For purposes of this description, certain aspects, advantages, and novel features of the embodiments of this disclosure are described herein. The disclosed methods, apparatus, and systems should not be construed as being limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

All features described herein are independent of one another and, except where structurally impossible, can be used in combination with any other feature described herein.

As used in this application and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

In the description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

In view of the many possible embodiments to which the principles of the disclosed technology may be applied, it should be recognized that the illustrated embodiments are only preferred examples and should not be taken as limiting the scope of the disclosure. Rather, the scope of the disclosure is at least as broad as the following claims. We therefore claim all that comes within the scope and spirit of these claims.

The invention claimed is:

1. A positioning system, comprising:
    a drive unit comprising an actuator element, the actuator element comprising a piezoelectric material; and
    a control system configured to:
        select a path between a first position and a second position;
        identify at least one change of direction of the actuator element along the selected path;
        generate a hysteresis-compensated drive signal based at least in part on the change in direction; and apply the hysteresis-compensated drive signal to the actuator element to move an object along the path.

2. The positioning system of claim 1, wherein:
the control system further comprises a processor and a memory unit in communication with the processor, the memory unit storing data of a hysteresis model of the actuator element; and
the processor is configured to generate the hysteresis-compensated drive signal based on the hysteresis model of the actuator element.

3. The positioning system of claim 2, wherein the hysteresis model of the actuator element comprises an equation of position of the actuator element when actuated between the first position and the second position by an uncompensated drive signal.

4. The positioning system of claim 2, wherein the hysteresis-compensated drive signal is based at least in part on an inverse equation of the hysteresis model.

5. The positioning system of claim 4, wherein the control system is further configured to determine the inverse equation of the hysteresis model.

6. The positioning system of claim 2, wherein the hysteresis model comprises a parabola based at least in part on a hysteresis parameter of the actuator element.

7. The positioning system of claim 6, wherein the hysteresis parameter is inversely proportional to a distance between a vertex of the parabola and a focal point of the parabola.

8. The positioning system of claim 1, wherein:
the control system further comprises a processor and a memory unit in communication with the processor, the memory unit storing data of hysteresis compensation signals; and
the processor is configured to generate the hysteresis-compensated drive signal based on the stored hysteresis compensation signal data.

9. The positioning system of claim 8, wherein the processor is configured to:
identify the at least one change of direction of the actuator element along the selected path;
select a hysteresis compensation signal from the memory unit based on the at least one change of direction; and
generate the hysteresis-compensated drive signal based on the selected hysteresis compensation signal.

10. The positioning system of claim 1, wherein the control system is configured to identify the at least one change of direction of the actuator element based on a sign of a rate of change of the hysteresis-compensated drive signal.

11. The positioning system of claim 1, wherein the hysteresis-compensated drive signal comprises a voltage signal.

12. The positioning system of claim 1, wherein the drive unit is configured to produce linear or rotational motion of the object along the selected path.

13. The positioning system of claim 1, wherein:
the actuator element is a piezoelectric shear element;
the drive unit further comprises a piezoelectric clamp element; and
the positioning system further comprises a mover element coupled to a carrier element configured to hold the object, the mover element being engaged by the drive unit and movable relative to the drive unit to position the object along the path.

14. The positioning system of claim 1, wherein the control system further comprises a lookup table comprising a plurality of predetermined hysteresis-compensated drive signals.

15. A charged particle microscope comprising the positioning system of claim 1.

16. A charged particle microscope, comprising:
a vacuum chamber;
a charged particle beam source configured to output a charged particle beam toward an object in the vacuum chamber; and
a positioning system coupled to the vacuum chamber and operable to position the object in the vacuum chamber relative to the charged particle beam, the positioning system comprising:
a drive unit comprising an actuator element, the actuator element comprising a piezoelectric material; and
a control system configured to:
select a path between a first position and a second position;
identify at least one change of direction of the actuator element along the selected path;
generate a hysteresis-compensated drive signal based at least in part on the change in direction; and
apply the hysteresis-compensated drive signal to the actuator element to move the object along the path in the vacuum chamber.

17. The charged particle microscope of claim 16, wherein:
the control system further comprises a processor and a memory unit in communication with the processor, the memory unit storing data of a hysteresis model of the actuator element; and
the processor is configured to generate the hysteresis-compensated drive signal based on the hysteresis model of the actuator element.

18. The charged particle microscope of claim 17, wherein the hysteresis model of the actuator element comprises an equation of position of the actuator element when actuated between the first position and the second position by an uncompensated drive signal.

19. The charged particle microscope of claim 17, wherein the hysteresis-compensated drive signal is based at least in part on an inverse equation of the hysteresis model.

20. The charged particle microscope of claim 16, wherein the charged particle microscope is a scanning transmission electron microscope.

* * * * *